(12) United States Patent
Tsuchiaki et al.

(10) Patent No.: US 7,939,869 B2
(45) Date of Patent: May 10, 2011

(54) SEMICONDUCTOR DEVICE HAVING A MAGNETIZATION CONFIGURATION OF SOURCE AND DRAIN FERROMAGNETIC ELECTRODES AND METHOD OF MANUFACTURING THE SAME

(75) Inventors: Masakatsu Tsuchiaki, Tokyo (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 338 days.

(21) Appl. No.: 12/234,082

(22) Filed: Sep. 19, 2008

(65) Prior Publication Data
US 2009/0200592 A1   Aug. 13, 2009

(30) Foreign Application Priority Data
Feb. 7, 2008   (JP) .................. 2008-027360

(51) Int. Cl.
*H01L 21/02* (2006.01)
(52) U.S. Cl. .............................. 257/295; 257/421; 438/3
(58) Field of Classification Search ........... 257/E29.167, 257/E29.164, E27.104, E29.323, 295, 421, 257/422; 438/3, 48
See application file for complete search history.

(56) References Cited

U.S. PATENT DOCUMENTS

| | | | |
|---|---|---|---|
| 6,482,729 B2* | 11/2002 | Ohno et al. | 438/602 |
| 6,963,091 B1* | 11/2005 | Vashchenko et al. | 257/213 |
| 7,248,497 B2* | 7/2007 | Saito et al. | 365/158 |
| 7,411,235 B2 | 8/2008 | Saito et al. | |
| 7,545,013 B2* | 6/2009 | Sugahara et al. | 257/421 |
| 2006/0227466 A1* | 10/2006 | Yagami | 360/324.2 |
| 2008/0061332 A1 | 3/2008 | Saito et al. | |

OTHER PUBLICATIONS

U.S. Appl. No. 12/200,169, filed Aug. 28, 2008, Inokuchi, et al.
Masaaki Tanaka, et al., "MOS-Based Spin Devices for Reconfigurable Logic", IEEE Transactions on Electron Devices, vol. 54, No. 5, May 2007, pp. 961-976.

* cited by examiner

*Primary Examiner* — Thao X Le
*Assistant Examiner* — Thanh Y Tran
(74) *Attorney, Agent, or Firm* — Oblon, Spivak, McClelland, Maier & Neustadt, L.L.P.

(57) ABSTRACT

A semiconductor device includes: a first source region and a first drain region formed at a distance from each other in a semiconductor substrate; a first gate insulating film formed on the semiconductor substrate between the first source region and the first drain region; a first gate electrode formed on the first gate insulating film; a first source electrode formed above the first source region and including a ferromagnetic layer having an easy axis of magnetization in a first direction; a first drain electrode formed above the first drain region and including a ferromagnetic layer magnetized in a second direction at an angle larger than 0 degrees but not larger than 180 degrees with respect to the first direction; and a second drain electrode formed above the first drain region, being located at a distance from the first drain electrode, and including a ferromagnetic layer magnetized in a direction substantially antiparallel to the second direction.

31 Claims, 17 Drawing Sheets

C-C' CROSS SECTION

SEMICONDUCTOR DEVICE HAVING A MAGNETIZATION CONFIGURATION OF SOURCE AND DRAIN FERROMAGNETIC ELECTRODES AND METHOD OF MANUFACTURING THE SAME

CROSS-REFERENCE TO RELATED APPLICATION

This application is based upon and claims the benefit of priority from prior Japanese Patent Application No. 2008-27360 filed on Feb. 7, 2008 in Japan, the entire contents of which are incorporated herein by reference.

BACKGROUND OF THE INVENTION

1. Field of the Invention

The present invention relates to a semiconductor device that includes a spin transistor having a MOS structure.

2. Related Art

The advent of ultrahigh-speed and high-functionality semiconductor devices had spurred rapid evolution of an information-oriented and knowledge-intensive society into a global web of high-speed communication networks, as exemplified by the ubiquitous presence of radiofrequency cellular or "mobile" phones in daily lives. Naturally, the world-wide spread of such social transformation, as well as an insatiable quest for more efficient and convenient life-styles, demands yet higher performance of semiconductor devices that are integrated on a single chip on an ever-larger scale, to realize a system-on-chip versatile architecture providing almost every conceivable functionality.

Unfortunately, however, in order to speed-up their operation, simply miniaturizing the physical dimensions of the principal components of the large scale integration (LSI) circuit, i.e., metal insulator semiconductor field effect transistors (MISFETs), or more specifically, metal oxide semiconductor field effect transistors (MOSFETs) is becoming a increasingly difficult task to achieve. It is believed that, such straightforward approach towards high-speed operation by shrinking dimension will soon encounter not only practical problems but also fundamental physical limitation as a way of achieving high-performance LSI.

Under these circumstances, a new approach to realize higher-performance electronic circuits by adding new sophisticated functionality to the conventional complementary silicon MOSFETs (C-MOSFETs) circuits is much desired.

In fact, an increasing attention is now directed towards the study of spin electronics, which utilize the spin degree of freedom of electrons, in addition to their electrical charges.

Particularly, a spin transistor having a MOSFET structure is thought to be a prime candidate of such a value-added higher-performance electronic device, thanks to its structural and functional compatibility with the prevailing conventional complementary silicon MOSFETs (C-MOSFETs) circuits.

Whereas the operation of the conventional MOSFETs is regulated simply by the electric charges flowing through the channel, the operation of the spin transistor having a MOSFET structure (hereinafter, referred to as the spin-MOSFET) is made to depend also on the spin of the channel carriers (see IEEE Trans. ED 54 (2007), p 961, by M. Tanaka and S. Saguahara, for example). Therefore, as a value-added versatile MOSFET, the spin-MOSFET can be easily and conveniently integrated into a current C-MOSFETs circuit, while providing additional sophisticated functions to the conventional circuit.

Nonetheless, as will be described later, the spin-MOSFET is not a problem free option for realizing higher-performance electronic circuits. As will be explained below, it is difficult to form a nonvolatile and reconfigurable logic circuit by a spin-MOSFET, while maintaining stable and reliable device operation and, at the same time, retaining the compatibility with the conventional C-MOSFET circuits.

SUMMARY OF THE INVENTION

The present invention has been made in view of these circumstances, and an object thereof is to provide a semiconductor device that includes a spin-MOSFET capable of forming a nonvolatile and reconfigurable logic circuit, while maintaining stable and reliable device operation and, at the same time, retaining compatibility with the conventional C-MOSFET circuits.

A semiconductor device according to a first aspect of the present invention includes: a semiconductor substrate; a first source region and a first drain region formed at a distance from each other in the semiconductor substrate; a first channel region provided between the first source region and the first drain region; a first gate insulating film formed on the first channel region; a first gate electrode formed on the first gate insulating film; a first source electrode formed above the first source region and including a ferromagnetic layer having an easy axis of magnetization in a first direction; a first drain electrode formed above the first drain region and including a ferromagnetic layer magnetized in a second direction at an angle larger than 0 degrees but not larger than 180 degrees with respect to the first direction;

and a second drain electrode formed above the first drain region, being located at a distance from the first drain electrode, and including a ferromagnetic layer magnetized in a direction substantially antiparallel to the second direction.

A semiconductor device according to a second aspect of the present invention includes: a semiconductor substrate including a first semiconductor region of a first conductivity type;

a first source region of a second conductivity type formed in the first semiconductor region; first and second drain regions of the second conductivity type formed at a distance from the first source region, and formed at a distance from each other in the first semiconductor region; a first channel region provided between the first source region and the first drain region, and between the first source region and the second drain region; a first gate insulating film formed on the first channel region; a first gate electrode formed on the first gate insulating film; a first source electrode formed above the first source region and including a ferromagnetic layer having an easy axis of magnetization in a first direction; a first drain electrode formed above the first drain region and including a ferromagnetic layer magnetized in a second direction at an angle larger than 0 degrees but not larger than 180 degrees with respect to the first direction;

and a second drain electrode formed above the second drain region and including a ferromagnetic layer magnetized in a direction substantially antiparallel to the second direction.

DETAILED DESCRIPTION OF THE INVENTION

The following is a description of embodiments of the present invention, with reference to the accompanying drawings.

First, the operation principle of the spin-MOSFETs is critically reviewed in order to illustrate abovementioned technical difficulties in realizing dependable, realiable, and CMOS-FET-compatible nonvolatile reconfigurable logic circuits by the spin-MOSFETs.

<Classification of Spin-MOSFETs and their Operating Principles>

In general, a MOSFET whose operation depends on the spin degree of freedom of the channel carriers can be realized either (1) by forming the ferromagnetic source and drain electrodes, or otherwise (2) by forming the ferromagnetic source electrode on the channel-forming ferromagnetic semiconductor. Accordingly, the operation principles of the spin-MOSFET can be classified into two types.

[Type-1 Spin-MOSFET]

If the source electrode is formed with a ferromagnetic half-metal, for example, charged carriers injected from the source electrode into the semiconducting channel region are spin-polarized in the magnetization direction of the half-metal (or in the spin direction of the free carriers around the Fermi level of the half-metal).

The spin-polarized carriers thus injected from the source electrode flow all the way through the channel and reach the drain electrode, preserving their spin-polarization.

When the drain electrode is formed with another ferromagnetic half-metal and its magnetization direction is aligned parallel to the magnetization direction of the half-metal source electrode, the spin-polarized channel carriers can smoothly flow into the drain electrode without any obstruction.

Therefore, the type-1 spin-MOSFET in this parallel magnetization configuration acts as an ordinary MOSFET.

On the other hand, once the magnetization direction of the drain electrode is aligned antiparallel to the magnetization direction of the half-metal source electrode, the spin-polarized channel carriers cannot flow into the drain electrode. Without current flow between the source and drain electrodes, the MOSFET is effectively in an off-state. The channel current starts to flow only when the drain voltage becomes large enough so that it enables physical transition of the spin-polarized channel carriers into the drain electrode's electronic states with the same spin-polarization. It should be remembered that the energy levels of the drain electrode's electronic states having the same spin states as those of the channel carriers are located far above the Fermi level of the half-metal.

Therefore, the type-1 spin-MOSFET in this antiparallel magnetization configuration acts as a dysfunctional MOSFET.

In this manner, the MOSFET operation of the type-1 spin-MOSFET can be modulated by changing the relative magnetization directions of the ferromagnetic source and drain electrodes from parallel to antiparallel configuration and vice versa.

Figure 1:
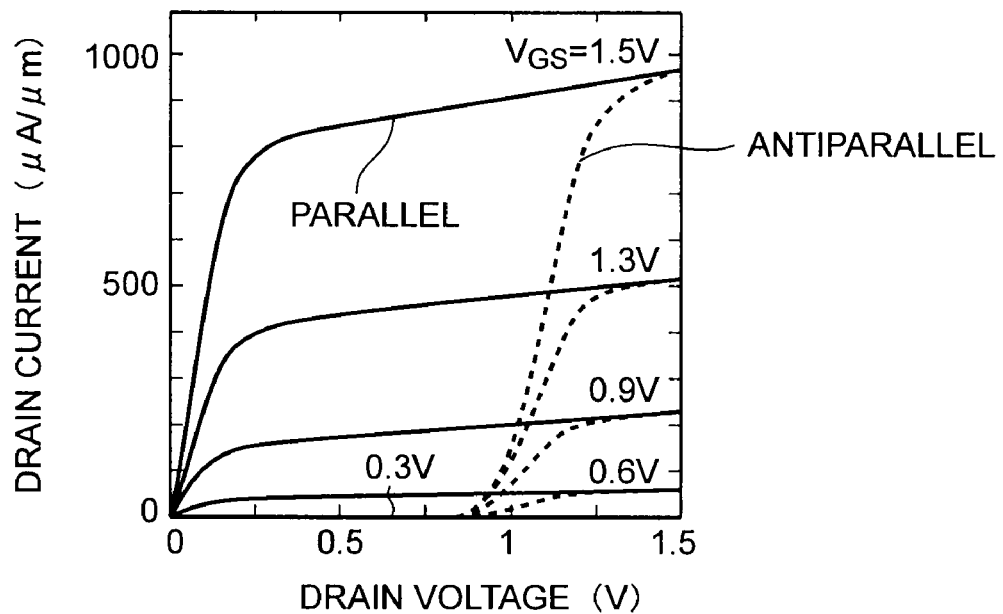
FIG. 1 shows the drain currents of the type-1 spin-MOSFET as functions of the drain voltage at various gate voltages for both parallel and antiparallel magnetization configurations.

FIG. 1 schematically shows the drain currents of the above spin-MOSFET (i.e., the type-1 spin-MOSFET) as functions of the drain voltage (with the source electrode being grounded) at various gate voltages, for both parallel magnetization configuration (solid lines) and antiparallel magnetization configuration (dotted lines).

Hereinafter, the device in the above two configurations will be simply referred to as the type-1 spin-MOSFET "in the parallel state" and that "in the antiparallel state", respectively.

[Type-2 Spin-MOSFET]

Another type of spin-MOSFET (i.e., the type-2 spin-MOSFET) can be obtained by providing a ferromagnetic source electrode over a channel-forming ferromagnetic semiconductor. In this case, the operation of type-2 spin-MOSFET is modulated by changing the relative magnetization directions of the ferromagnetic source electrode and the channel-forming ferromagnetic semiconductor from parallel to antiparallel configuration and vice versa.

When the magnetization direction of the ferromagnetic source electrode is parallel to the magnetization direction of the ferromagnetic semiconductor channel, the energy barrier (i.e., Schottky barrier, $\Phi_p$), which the spin-polarized free carriers in the ferromagnetic source electrode must overcome to flow into the ferromagnetic semiconductor channel, is smaller than the corresponding energy barrier (i.e., Schottky barrier, ($\Phi_a$) encountered by the spin-polarized free carriers when the magnetization direction of the ferromagnetic source electrode is antiparallel to the magnetization direction of the ferromagnetic semiconductor channel.

Accordingly, when the magnetization direction of the ferromagnetic source electrode is made antiparallel to the magnetization direction of the ferromagnetic semiconductor channel, the channel current flowing in the MOSFET (i.e., the drain current) is reduced compared to that observed under a parallel magnetization configuration, by a constant factor depending on the difference between the above described energy barriers (i.e., $\Phi_a - \Phi_p$).

It should be noted here that, in the type-2 spin-MOSFET, a regular nonmagnetic metal can be utilized as the drain electrode. Of course, a ferromagnetic metal magnetized in a direction parallel to the magnetization direction of the ferromagnetic source electrode can be used as a drain electrode as well. In either case, the spin-polarized channel carriers injected from the source electrode can flow freely into the drain electrode without restriction.

In this manner, the operation of type-2 spin-MOSFET can be modulated by changing the relative magnetization directions of the ferromagnetic source electrode and the channel-forming ferromagnetic semiconductor from parallel to antiparallel configuration and vice versa.

Figure 2:
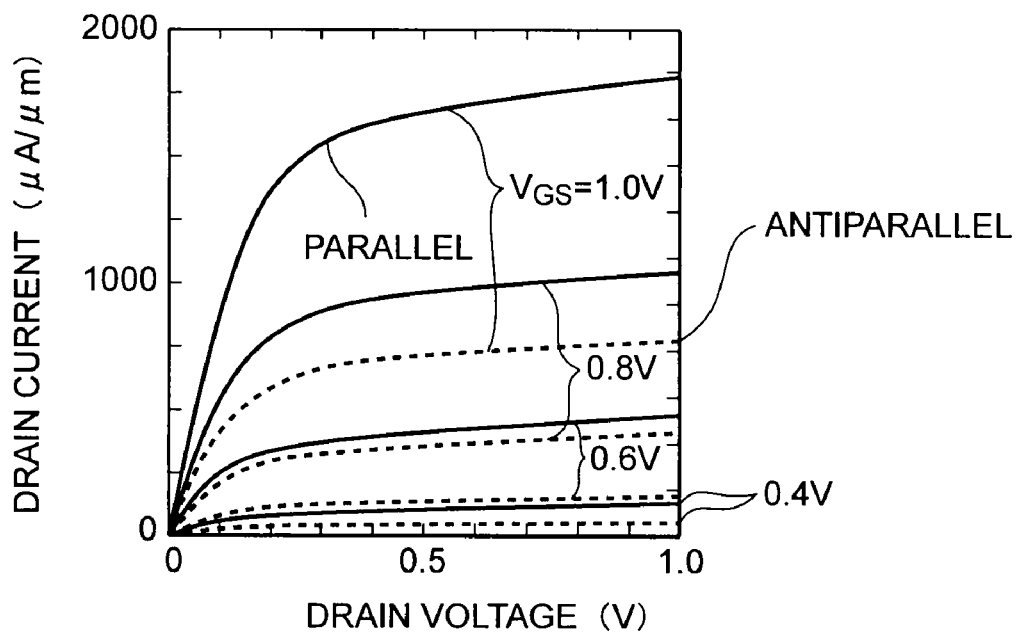
FIG. 2 shows the drain currents of the type-2 spin-MOSFET as functions of the drain voltage at various gate voltages for both parallel and antiparallel magnetization configurations.

FIG. 2 schematically shows the drain currents of the above spin-MOSFET (i.e., the type-2 spin-MOSFET) as functions of the drain voltage (with the source electrode being grounded) at various gate voltages, for both parallel magnetization configuration (solid lines) and antiparallel magnetization configuration (dotted lines).

As in the case of the type-1 spin-MOSFET, the device in the above two configurations will be referred to simply as the type-2 spin-MOSFET "in the parallel state" and that "in the antiparallel state", respectively.

<Problems with the Spin-MOSFETs>

Unfortunately, depending on the difference in the above-explained physical mechanisms of the magnetization-induced current modulation, the spin-MOSFETs of the respective types suffer from their own distinctive technical problems.

The following is a detailed description of those problems illuminated from three principal viewpoints.

[Point 1: Regarding Compatibility with the Conventional C-MOSFET Circuits]

In order to form the type-1 spin-MOSFET, one can employ conventional C-MOSFET manufacturing procedures for constructing the MOS structure. The type-1 spin-MOSFET can be readily realized by simply forming ferromagnetic electrodes on the obtained MOS structure (e.g., by depositing ferromagnetic metals such as NiFe alloys on the source and drain regions).

Obviously, type-1 spin-MOSFET retains excellent manufacturing compatibility with the conventional C-MOSFET circuits, and therefore, is a favorable option for realization of value-added higher-performance C-MOSFET circuits.

On the other hand, in order to form the type-2 spin-MOSFET, a ferromagnetic semiconductor is indispensable. In theory, such ferromagnetic semiconductors can be obtained by partially substituting the host atoms of such semiconductors as CdTe, ZnSe, GaAs, or InSb with magnetic atoms, such as Mn.

Unfortunately, however, the ferromagnetism of such magnetic semiconductors can be realized only at much lower temperatures than the room temperature.

Furthermore, the physical mechanism of the emergence of such ferromagnetic ordering depends strongly on the concentration of charged carriers in the semiconductor. Such strong dependency on the carrier concentration of the semiconductor ferromagnetism disqualifies the ferromagnetic semiconductors as a channel material of a MOSFET. This is because, for the MOSFET, a stable and reliable operation against rapid and precipitous changes in the channel carrier concentration is required.

Needless to say, such channel ferromagnetic semiconductors must be additionally formed if they are to be integrated into conventional silicon C-MOSFET circuits. In other words, the formation of the spin-MOSFET structure requires specialized and specific procedures completely different from and totally incompatible with the conventional C-MOSFET formation.

Obviously, the type-2 spin-MOSFET lacks required virtue of manufacturing compatibility with the conventional C-MOSFET circuits. Remembering also its inability of the room temperature operation and its unstable physical properties, it is clear that the type-2 spin MOSFET is inappropriate for the realization of value-added higher-performance C-MOSFET circuits.

Now it can be concluded that, in terms of the manufacturing and operational compatibility with the conventional C-MOSFET circuits, the type-1 spin-MOSFET is much more desirable than the type-2 spin-MOSFET.

[Point 2: Regarding Technical Merits Obtained by Spin-MOSFET]

It can be easily agreed upon that one of the most desired function to be added to the conventional C-MOSFET circuits by utilizing the nonvolatile magnetic modulation of the spin-MOSFET is nonvolatile reconfigurable logic operation.

Figure 3:
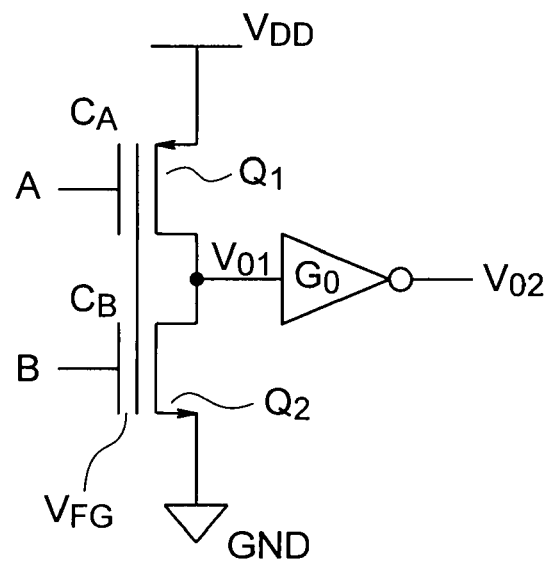
FIG. 3 is an example of reconfigurable logic circuit realized by a spin-MOSFET.

A founding element of such reconfigurable logic circuits can be realized with a spin-MOSFET as shown in FIG. 3. In this circuit, two inputs A and B are capacitively-coupled to a floating gate, which is then acts as an input to an inverter. The inverter consists of a conventional MOSFET $Q_1$ and a spin-MOSFET $Q_2$.

Figure 4:
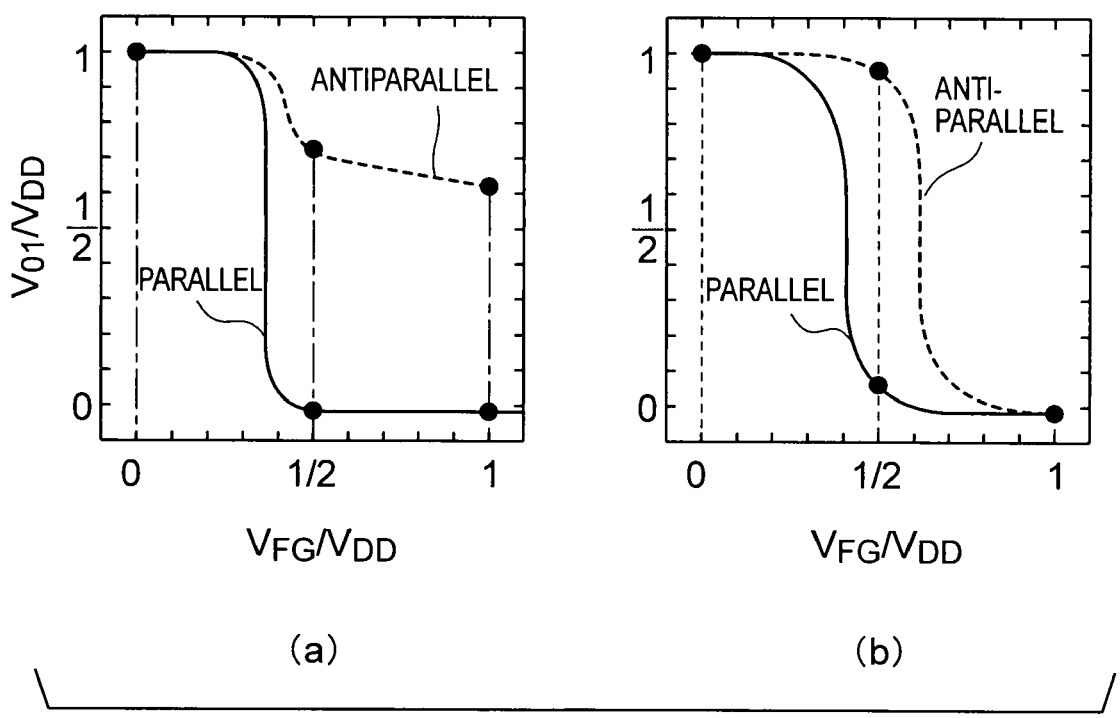
FIG. 4(a) show output voltage $V_{O1}$ as a function of floating gate voltage $V_{FG}$, both for the parallel state and the antiparallel state, when a type-1 spin-MOSFET is used as the spin-MOSFET in FIG. 3.
FIG. 4(b) show output voltage $V_{O1}$ as a function of floating gate voltage $V_{FG}$, both for the parallel state and the antiparallel state, when a type-2 spin-MOSFET is used as the spin-MOSFET in FIG. 3.

FIG. 4(a) shows the output voltage $V_{O1}$ as a function of the floating gate voltage $V_{FG}$, both for the parallel state (solid line) and the antiparallel state (dotted line), when a type-1 spin-MOSFET is used as the spin-MOSFET $Q_2$. Here, the GND level is denoted as "0" and the supply voltage is denoted as $V_{DD}$.

Likewise, FIG. 4(b) shows the output $V_{O1}$ as a function of the floating gate voltage $V_{FG}$, both for the parallel state (solid line) and the antiparallel state (dotted line), when a type-2 spin-MOSFET is used as the spin-MOSFET $Q_2$.

When the two inputs A and B are both held at "0", $V_{FG}$ stays also at "0". Accordingly, as can be seen from FIGS. 4(a) and 4(b), the output $V_{O1}$ becomes $V_{DD}$, regardless the type and magnetization configuration of the spin-MOSFET $Q_2$.

When only one of the two inputs A and B is raised to $V_{DD}$, $V_{FG}$ becomes about a half of $V_{DD}$. In this case, $V_{O1}$ depends on the magnetization configuration of the spin-MOSFET $Q_2$. If the spin-MOSFET $Q_2$ is in the parallel state, $V_{O1}$ drops close to the GND level. On the other hand, if the spin-MOSFET $Q_2$ is in the antiparallel state, $V_{O1}$ stays close to $V_{DD}$.

When both A and B are raised to $V_{DD}$, $V_{FG}$ also becomes $V_{DD}$. In this case, $V_{O1}$ depends not only on the magnetization configuration but also on the type of the spin-MOSFET $Q_2$. In a case where a type-1 spin-MOSFET is utilized as $Q_2$, $V_{O1}$ comes close to $V_{DD}$ when $Q_2$ is in the antiparallel state, whereas $V_{O1}$ goes down close to the GND level when $Q_2$ is in the parallel state (see FIG. 4(a)). On the other hand, in a case where a type-2 spin-MOSFET is utilized as $Q_2$, $V_{O1}$ remains at the GND level, irrespective of the magnetization configuration of the spin-MOSFET $Q_2$ (see FIG. 4(b)).

Therefore, if the above output $V_{O1}$ is further fed to the latter-stage inverter $G_0$ as shown in FIG. 3, its output $V_{O2}$ to the two logic inputs A and B changes from "OR" to "AND", when the magnetization configuration of the type-2 spin MOSFET shifts from the parallel state to the antiparallel state.

As a result, when a type-2 spin-MOSFET is used as the spin-MOSFET $Q_2$, the two-input logic circuit of FIG. 3 can be successfully reconfigured between an OR circuit and an AND circuit, depending on the magnetization configuration of the spin-MOSFET.

On the other hand, the output $V_{O2}$ to the two logic inputs A and B is simply reduced to a useless fixed-value function when the type-1 spin-MOSFET is in the antiparallel state, whereas $V_{O2}$ to the two logic inputs A and B can realize "OR" function in the parallel state.

As a result, when a type-1 spin-MOSFET is used as the spin-MOSFET $Q_2$, it is difficult to form a nonvolatile reconfigurable logic circuit.

Now, it is apparent from the above consideration, that the type-2 spin-MOSFET is much more advantageous to the realization of nonvolatile reconfigurable logic circuits (i.e., the most desired form of the value-added C-MOSFET circuits by utilizing the nonvolatile magnetic modulation of the spin-MOSFET operation).

[Point 3: Regarding Stability of Spin MOSFET Operation]

As described above, in order to form a type-2 spin-MOSFET, a ferromagnetic semiconductor is required. At present, ferromagnetic semiconductors can be realized only at lower temperatures than the room temperature. Furthermore, the ferromagnetic ordering of the ferromagnetic semiconductors strongly depends on the concentration of the charged carriers in the semiconductors. Such a strong dependency on the carrier concentration and the inability of the room-temperature operation disqualify the ferromagnetic semiconductors as a channel material of a MOSFET, which requires stable room-temperature operation against rapid and drastic changes in charge carrier concentration in the channel region.

On the other hand, the magnetization-induced current modulation of the type-1 spin-MOSFET arises from spin-dependent selective admission of the channel carriers into the half-metal drain electrode. It is not derived from any "spin-selective charge injection" from the source electrode. In fact, there is no such mechanism as spin-selective charge injection in the type-1 spin-MOSFET. Regardless of the relative magnetization of the ferromagnetic source and drain electrodes, whenever an appropriate gate voltage is applied to the gate electrode to induce a channel inversion layer (i.e., the MOSFET being set in "on-state"), spin-polarized carriers start to be injected into the channel semiconductor from the source electrode, according only to an electrostatic mechanism, and begin to be attracted towards the drain electrode by the drain voltage.

Figure 5:
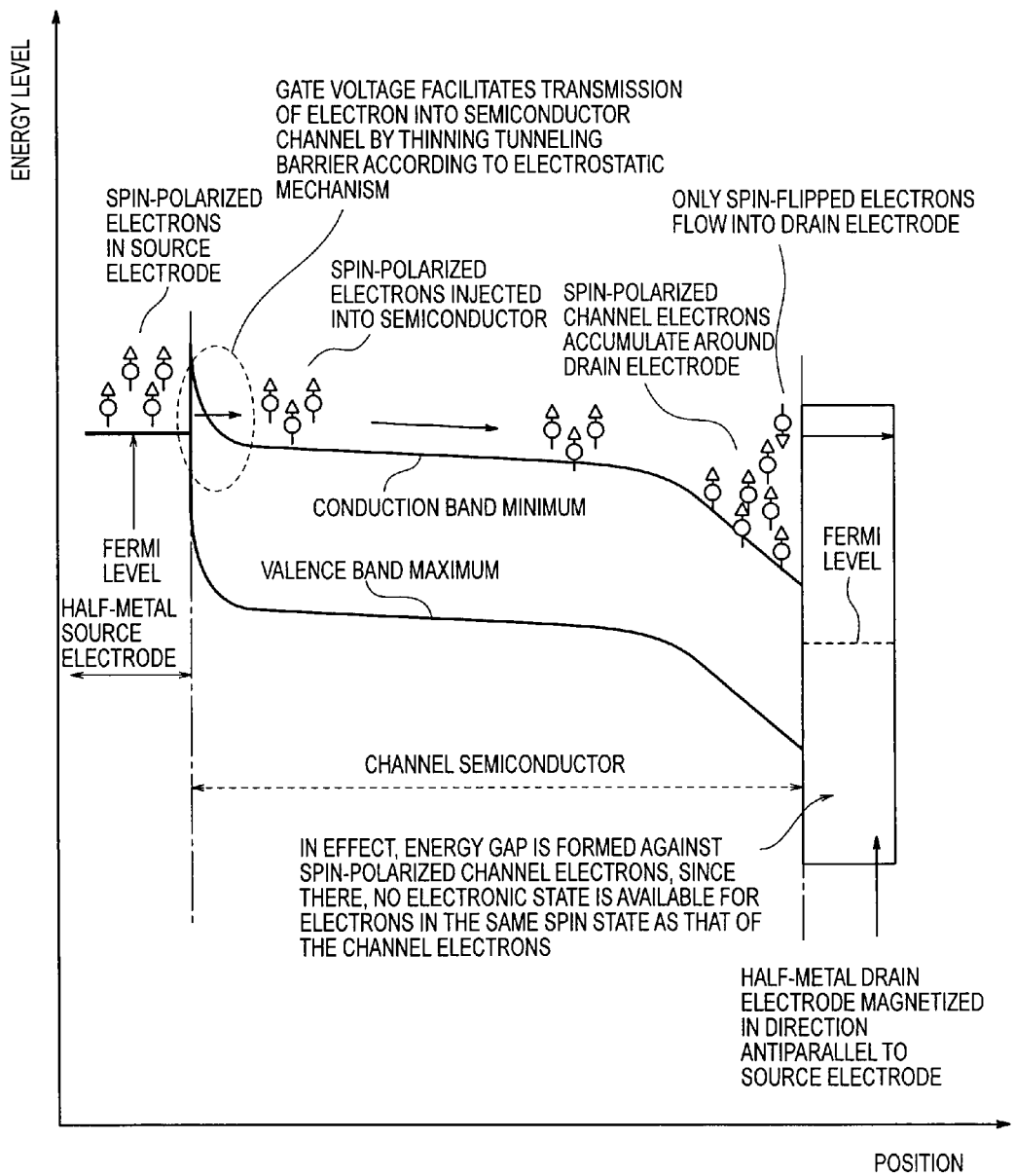
FIG. 5 is an energy band diagram explaining the device operation of the type-1 spin MOSFET in the antiparallel state.

However, if the type-1 spin-MOSFET is in the antiparallel state, the spin-polarized channel carriers, which have just traveled all the way through the channel to the drain region, cannot flow into the drain electrode. As a result, the arriving spin-polarized channel carriers gradually accumulate around the drain electrode, as illustrated in FIG. 5 using an energy band diagram of a channel surface of the type-1 spin-MOSFET.

The charge accumulation with time inevitably induces a temporal variation of electrostatic potential in the channel semiconductor, which then leads to a transient change in the device operation. Moreover, some of the impeded and stagnant carriers around the drain electrode may flip their spins due to spin-dependent interactions with impurities or crystalline defects in the semiconductor or due to thermal perturbation. Such spin-flipped carriers then start to flow into the drain electrode, causing stochastic fluctuation of the channel current.

With such temporal variation and stochastic fluctuation of the device operation, it is difficult to realize stable and reliable circuits suitable for mass-production by means of the type-1 spin-MOSFET. Successful mass-production of-course requires formation of large numbers of uniform devices exactly performing strictly designed functions.

OBJECTIVES OF THE PRESENT INVENTION

To sum up the above arguments, both types of the spin-MOSFET suffer from respective technical problems as specified in terms of the above three points.

In terms of the manufacturing and operational compatibility with the conventional C-MOSFET circuits, the type-1 spin-MOSFET is much more desirable than the type-2 spin-MOSFET. However, it is difficult to form a nonvolatile reconfigurable logic circuit with the type-1 spin-MOSFET. In addition, the temporal variation and stochastic fluctuation of the device operation make it difficult to realize stable and reliable circuits with the type-1 spin-MOSFET.

On the other hand, in terms of the technical merit, the type-2 spin-MOSFET is much more advantageous to the realization of nonvolatile reconfigurable logic circuits than the type-1 spin-MOSFET. However, the type-2 spin-MOSFET lacks required manufacturing compatibility with the conventional C-MOSFET circuits. In addition, the device operation's strong dependency on the carrier concentration and the inability of the room-temperature operation disqualify the type-2 spin-MOSFET as a usable MOSFET.

Cleary, it is very difficult to have a spin-MOSFET suitable for nonvolatile reconfigurable logic circuits, which not only retains the manufacturing and operational compatibility with the conventional C-MOSFET circuits, but also realizes stable and reliable device operation.

Accordingly, the present inventors intend to provide a spin-MOSFET suitable for nonvolatile reconfigurable logic circuits, which not only retains the manufacturing and operational compatibility with the conventional C-MOSFET circuits, but also realizes stable and reliable device operation. The details of such a spin-MOSFET will be clarified through the following description of embodiments of the present invention.

First Embodiment

[Fundamental Components of the Spin-MOSFET of the Present Invention]

Figure 6:
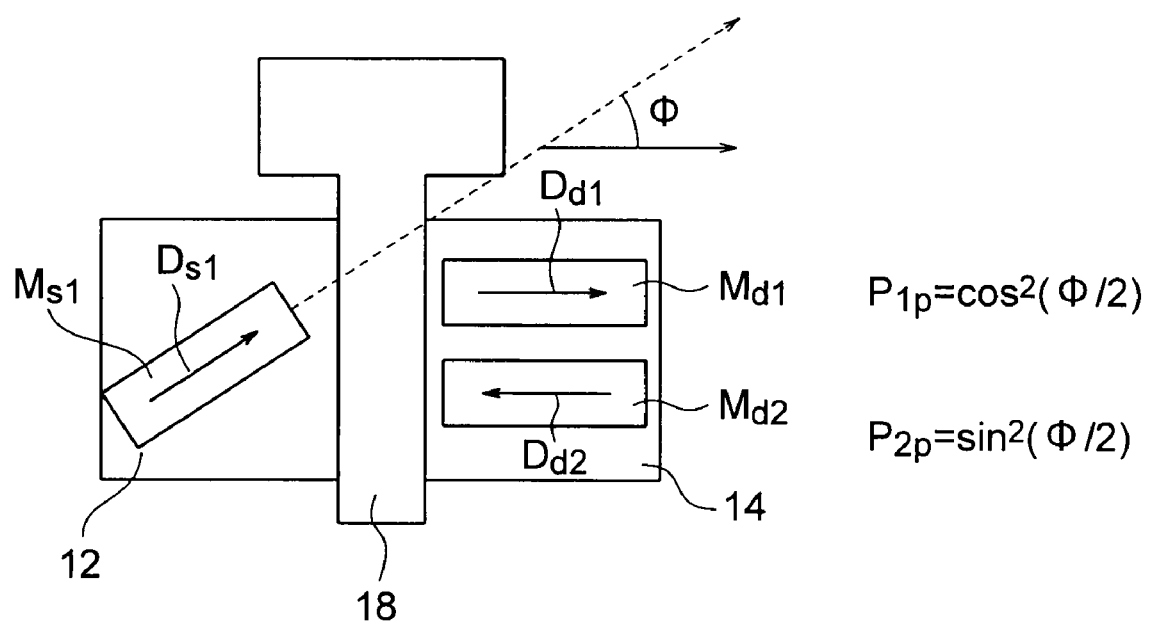
FIG. 6 is a plan view of a spin-MOSFET in accordance with a first embodiment of the present invention.

FIG. 6 is a plan view outline of a spin-MOSFET in accordance with a first embodiment of the present invention.

The spin MOSFET of this embodiment includes: a source region 12 and a drain region 14 that are formed at a distance from each other in a semiconductor substrate (not shown); a gate insulating film (not shown) that is formed on the channel region of the semiconductor substrate located between the source region 12 and the drain region 14; a gate electrode 18 that is formed on the gate insulating film; a half-metal source electrode $M_{s1}$ that is formed on the source region 12 and is magnetized in a first direction $D_{s1}$; a half-metal drain electrode $M_{d1}$ that is formed on the drain region 14 and is magnetized in a second direction $D_{d1}$ that differs from the first direction $D_{s1}$;

and a half-metal drain electrode $M_{d2}$ that is formed on the drain region 14, is magnetized in a third direction $D_{d2}$ antiparallel to the second direction $D_{d1}$, and is located physically at a distance from the half-metal drain electrode $M_{d1}$.

In this structure, the half-metal source electrode $M_{s1}$ magnetized in the first direction $D_{s1}$ is provided on the source region 12, and the pair of half-metal drain electrodes $M_{d1}$ and $M_{d2}$ magnetized in the respective directions $D_{d1}$ and $D_{d2}$ that differ from the first direction $D_{s1}$ and are antiparallel to each other are provided on the drain region 14.

While the magnetization directions of the drain electrodes $M_{d1}$ and $M_{d2}$ are fixed in the respective directions $D_{d1}$ and $D_{d2}$, the magnetization direction of the source electrode $M_{s1}$ is made to be switched from $D_{s1}$ to a direction $D_{s2}$ antiparallel to (i.e., 180-degrees different from) $D_{s1}$. The directions $D_{s1}$ and $D_{s2}$ run along an easy axis of magnetization of $M_{s1}$.

[Basic Properties of Electron Spins]

Here, in order to facilitate understanding of the operation principle of the present spin-MOSFET, basic physics of the electron spin is summarized first.

The electron's spin degree of freedom is originated from the relativistic covariance of the quantum field of the elementary particle. In the nonrelativistic limit, the ½ spin of the electron can be expressed as a vector in the representation space (linear space) of the extended rotational group SU(2), which is otherwise simply referred to as a "spinor". The same is also true for electrons and holes in materials.

It should be noted that the spinor is different from a usual vector in the real space. Unlike the usual vector in the real 3-dimensional space, the spinor is in the complex 2-dimensional linear space.

Accordingly, an electron spin state (i.e., a spinor) can be expressed as a linear combination of a pair of orthonormal bases. These two bases, forming a complete orthonormal set, are customary called as "Up" and "Down" states.

Since one-to-one correspondence can be established between each one of the physically-equivalent complete orthonormal sets and each one of the possible pairs of antiparallel directions in the real space (i.e., a quantization axis), any 2-element complete orthonormal set (i.e., "Up" and "Down" states) can be represented by a pair of antiparallel directions in the real space.

In a ferromagnetic metal magnetized along a certain direction, the majority of electrons in the ferromagnetic metal have a single spin state represented by a sole basis corresponding to the magnetization direction. The rest of the minority electrons has a spin state singly represented by the other basis corresponding to a direction antiparallel to the magnetization direction (i.e., the basis orthonormal to the basis of the majority electrons).

If the ferromagnetic metal is a half-metal, all the free electrons in the vicinity of the Fermi level have a single spin state solely represented by the basis corresponding to the magnetization direction. Since no other spin states are available around the Fermi level, electrons spin-polarized along the antiparallel direction cannot enter the half-metal.

In other words, a spin state of free electrons in a half-metal magnetized in one direction and a spin state of free electrons in another half-metal magnetized in the antiparallel direction, when both combined, constitute a complete orthonormal set of the spinor (i.e., the electron spin state).

[Operation Principle of the Present Spin-MOSFET]

Next, the operation principle of the spin-MOSFET in accordance with this embodiment is described.

For simplicity, the spin-MOSFET of this embodiment is chosen to be an n-channel MOSFET formed on silicon. Thus, it is assumed that n-type impurities are implanted in the source and drain regions.

As explained above, the spin state of spin-polarized electrons injected from the source half-metal $M_{s1}$ into the channel region can be solely represented by $|D_{s1}\rangle$ (i.e., the basis corresponding to the first magnetization direction $D_{s1}$).

Since the spin-orbit interaction in the silicon is small, the spin state $|D_{s1}\rangle$ of the injected channel electrons is preserved until they reach the drain region 14.

On the other hand, the spin states admissive into the respective drain half-metals $M_{d1}$ and $M_{d2}$ are restricted to bases $|D_{d1}\rangle$ and $|D_{d2}\rangle$, corresponding to the individual magnetization directions $D_{d1}$ and $D_{d2}$ of these electrodes.

Since $D_{d1}$ and $D_{d2}$ are antiparallel to each other, $|D_{d1}\rangle$ and $|D_{d2}\rangle$ form a complete orthonormal set of the spin state. Thus, the spin state $|D_{s1}\rangle$ of the channel electrons can be expressed as a linear combination of $|D_{d1}\rangle$ and $|D_{d2}\rangle$.

According to the quantum principle, the probabilities $P_{1p}$ and $P_{2p}$ of the channel electrons in the spin state $|D_{s1}\rangle$ being allowed in the respective drain half-metals $M_{d1}$ and $M_{d2}$ can be determined by projecting the spin state $|D_{s1}\rangle$ onto $|D_{d1}\rangle$ and $|D_{d2}\rangle$.

When, as shown in FIG. 6, the internal angle between the first direction $D_{s1}$ and the second direction $D_{d1}$, the probabilities $P_{2p}$ is denoted by $_{1p}$ and $P_{2p}$ can be obtained as:

$$P_{1p} = \cos^2(\Phi/2)$$

$$P_{2p} = \sin^2(\Phi/2)$$

by using simple spinor algebra.

It should be noted that the probabilities depend only on the angle $\Phi$ between the first direction $D_{s1}$ and the second direction $D_{d1}$. It should be also noted that these probabilities add up to unity.

Accordingly, among the currents $I_s$ flowing from the source electrode $M_{s1}$, the current $I_{d1} = P_{1p} \times I_s$ flows into the drain electrode $M_{d1}$, and the current $I_{d2} = P_{2p} \times I_s$ flows into the drain electrode $M_{d2}$.

Figure 7A:
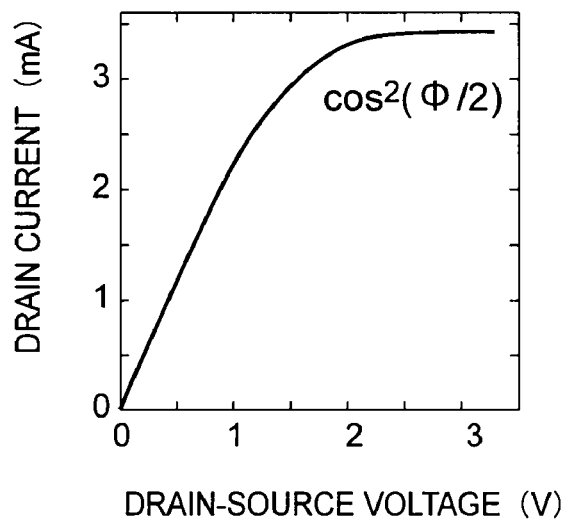
FIGS. 7A, 7B, and 7C explains drain currents as functions of the drain voltage at a fixed gate voltage observed at the antiparallel ferromagnetic drain electrodes under various magnetization configuration of the source electrode.
Figure 7B:
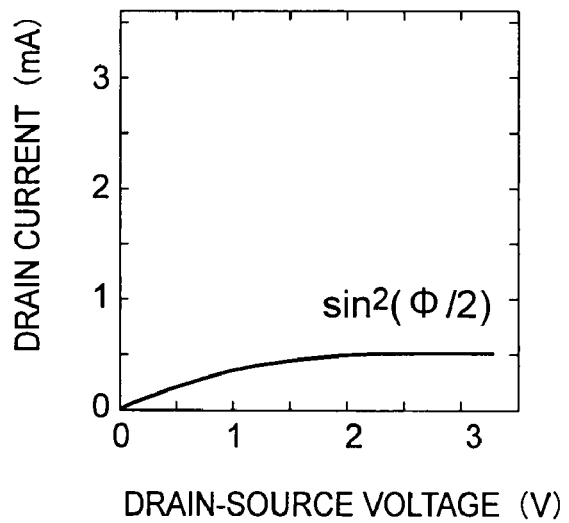

The corresponding drain currents $I_{d1}$ and $I_{d2}$ are shown in FIGS. 7A and 7B, respectively, as functions of the drain voltage at a fixed gate voltage.

Figure 8:
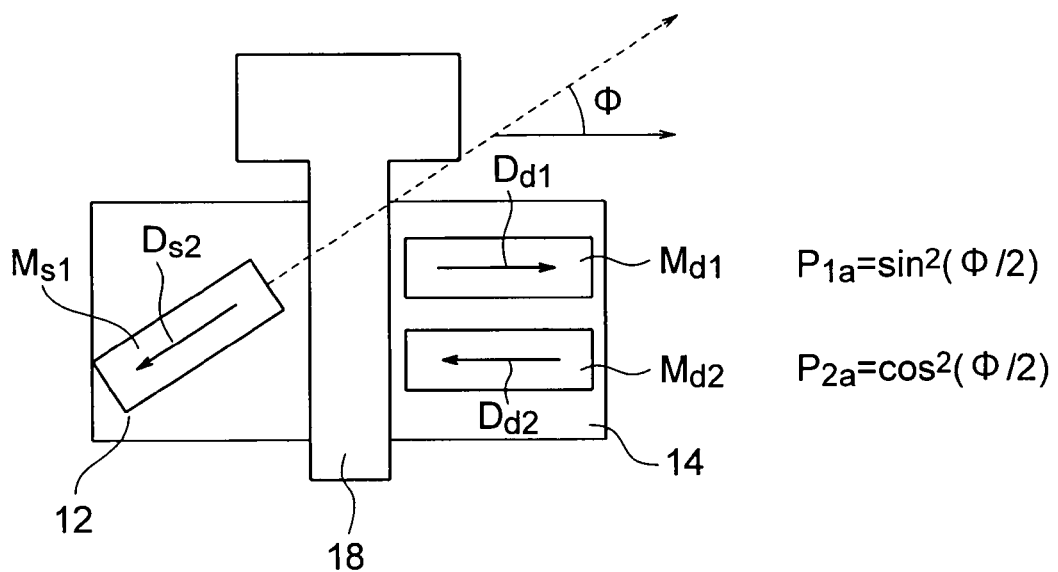
FIG. 8 is a top view explaining a magnetization configuration of source and drain ferromagnetic electrodes of the spin-MOSFET of the first embodiment.

Now, assume, as shown in FIG. 8, the magnetization direction of the source electrode $M_{s1}$ is switched from $D_{s1}$ to a direction $D_{s2}$ antiparallel to $D_{s1}$. The method of this magnetization reversal will be described later in the second embodiment.

In this case, the probabilities $P_{1a}$ and $P_{2a}$ can be obtained as:

$$P_{1a} = \sin^2(\Phi/2) = P_{2p}$$

$$P_{2a} = \cos^2(\Phi/2) = P_{1p}$$

also by using simple spinor algebra.

Accordingly, among the currents $I_s$ flowing from the source electrode $M_{s1}$, the current $I_{d1} = P_{1a} \times I_s$ flows into the drain electrode $M_{d1}$, and the current $I_{d2} = P_{2a} \times I_s$ flows into the drain electrode $M_{d2}$.

The corresponding drain currents $I_{d1}$ and $I_{d2}$ are shown in FIGS. 7B and 7A, respectively, as functions of the drain voltage at a fixed gate voltage.

Figure 7C:
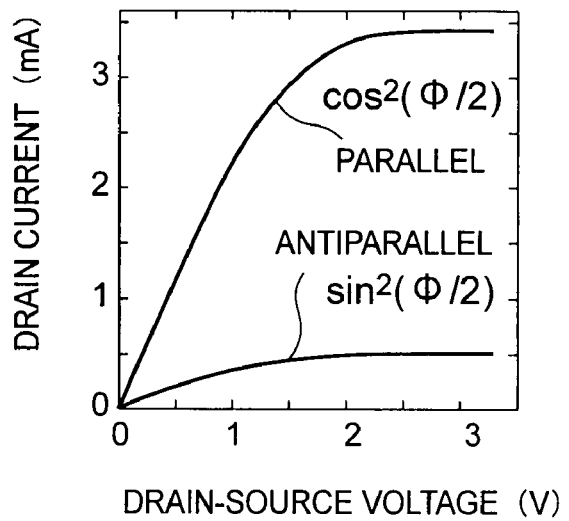

If one focuses on the current $I_{d1}$ flowing into the drain electrode $M_{d1}$, one can realize that the present spin-MOSFET behaves exactly like a type-2 spin-MOSFET by switching the magnetization of the source electrode $M_{s1}$, as shown in FIG. 7C.

However, unlike the type-2 spin-MOSFET, the present spin-MOSFET can be realized simply by forming ferromagnetic electrodes on the conventional MOS structure and dispense with an unstable magnetic channel semiconductor, much like a type-1 spin-MOSFET.

Nonetheless, unlike the type-1 spin-MOSFET, the spin-polarized channel electrons injected from the source half-metal $M_{s1}$ are always allowed to flow into either $M_{d1}$ or $M_{d2}$. Thus, undesirable accumulation of admission-rejected charges around the drain region is avoided. The absence of the charge accumulation prevents temporal variation of electrostatic potential in the channel semiconductor and also suppresses unwanted spin-flips of the channel electrons induced by spin-dependent interactions with impurities or crystalline defects or due to thermal perturbation.

[Advantages of the Present Spin-MOSFET]

Now, the advantages of the present spin-MOSFET become clear.

Because the present spin-MOSFET behaves much like a type-2 spin-MOSFET, the present spin-MOSFET is very suitable for nonvolatile reconfigurable logic circuits.

In addition, because the present spin-MOSFET can be realized simply by forming ferromagnetic electrodes on the conventional MOS structure, the present spin-MOSFET retains manufacturing and operational compatibility with the conventional C-MOSFET circuits.

Furthermore, because the present spin-MOSFET can avoid undesirable charge accumulation around the drain region, stable and reliable device operation can be obtained with the present spin-MOSFET.

Therefore, the present spin-MOSFET readily realizes a spin-MOSFET suitable for nonvolatile reconfigurable logic circuits, which not only retains the manufacturing and operational compatibility with the conventional C-MOSFET circuits, but also is capable of stable and reliable device operation.

Moreover, because the extent of the magnetic modulation of the channel current depends only on the relative angles between the magnetization direction of the source electrode $M_{s1}$ and the magnetization directions of the drain electrodes $M_{d1}$ and $M_{d2}$, by appropriately placing the electrodes, the present spin-MOSFET can arbitrarily adjust the extent of the magnetic modulation, regardless of the materials used for the respective electrodes.

Thus, the present spin-MOSFET provides a large latitude and additional degree of freedom in designing optimized reconfigurable circuits.

Also, because the drain electrodes $M_{d1}$ and $M_{d2}$ are magnetized in directions antiparallel to each other, the demagnetizing fields of these electrodes can be significantly reduced even though these two electrodes are placed in the close vicinity of each other in the drain region 14.

Without adverse effects of the demagnetizing field, the magnetization of the drain electrodes $M_{d1}$ and $M_{d2}$ is stable against external magnetic stimuli and remains steady under unexpected thermal disturbances. This means that the magnetization direction of the source electrode $M_{s1}$ can be safely switched without changing the magnetization directions of the drain electrodes $M_{d1}$ and $M_{d2}$.

Thus, the present spin-MOSFET is capable of reliable switching of the device operation.

Yet another unique advantage of the present spin-MOSFET is, unlike both type-1 and type-2 spin-MOSFET, the availability of a pair of the drain electrodes $M_{d1}$ and $M_{d2}$, to which electrically independent metal wires can be connected. As will be demonstrated later in a separate embodiment, the duality of the drain electrodes and associated possibility of applying different electric potentials to the electrodes can provide additional versatility in realizing a new function by utilizing the nonvolatile magnetic modulation.

[Simple Modifications of the Present Spin-MOSFET]

Figure 9:
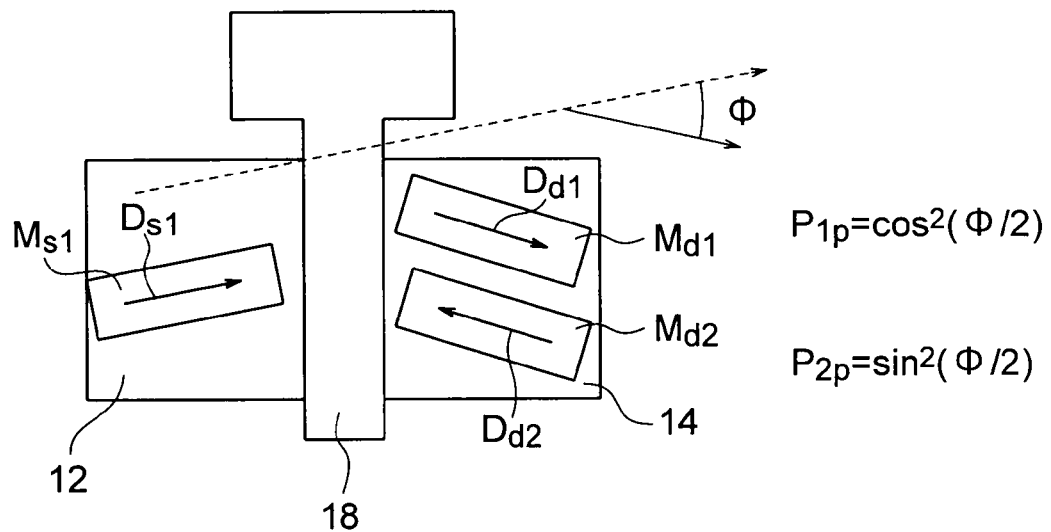
FIG. 9 is a top view of a spin-MOSFET in accordance with a first modification of the first embodiment.

Although FIGS. 6 and 8 show the cases where the magnetization directions $D_{d1}$ and $D_{d2}$ lie along the channel direction (i.e., the direction perpendicular to the gate electrode), the magnetization directions $D_{d1}$ and $D_{d2}$ can, of course, be aligned to any direction different from the channel direction, as shown in FIG. 9.

Since the extent of the magnetic modulation of the channel current depends only on the relative angles between the magnetization direction of the source electrode $M_{s1}$ and the magnetization directions of the drain electrodes $M_{d1}$ and $M_{d2}$, the same effects as those shown in FIGS. 7A, 7B, and 7C can be obtained as long as their relative angles are unchanged.

Likewise, although each of the source and drain electrodes is assumed to be a single ferromagnetic metal, it may, of course, be a stack of multi magnetic layers, coupled ferromagnetically or antiferromagnetically to each other and, with one or more nonmagnetic layers being interposed between the magnetic layers. Needless to say, not only in this embodiment, but also in the second and third embodiments to be described later, each of the source and drain electrodes could be made up of such a stack of multi magnetic layers.

For example, each electrode may be a three-layer stack of a ferromagnetic layer, a nonmagnetic layer, and a ferromagnetic layer, or even a five-layer stack of a ferromagnetic layer, a nonmagnetic layer, a ferromagnetic layer, a nonmagnetic layer, and a ferromagnetic layer. As long as the lowest ferromagnetic layers just over the drain region have the intended magnetization directions (i.e., antiparallel to each other), the operation principle of the present spin-MOSFET holds as is.

Figure 26:
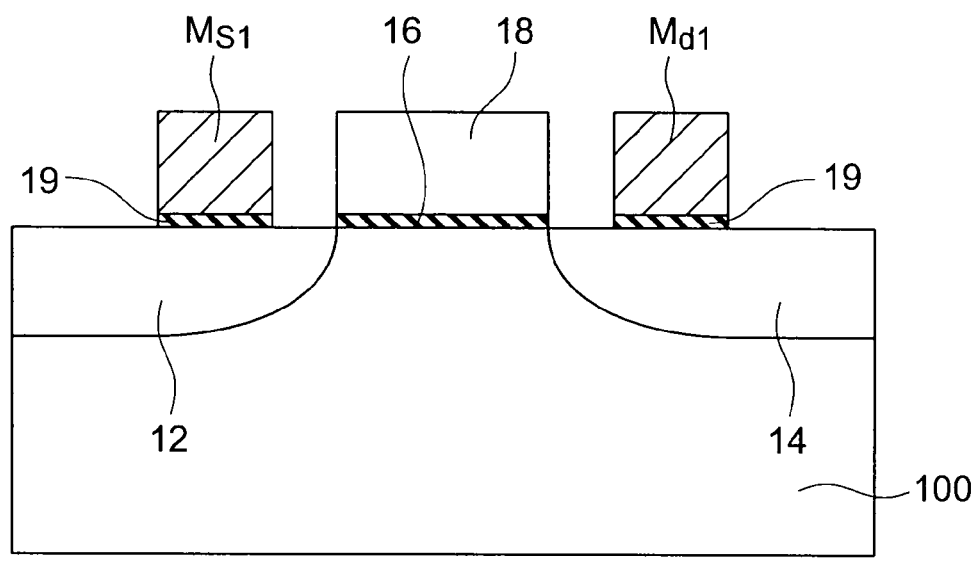
FIG. 26 is a cross-sectional view of a spin-MOSFET in accordance with a second modification of the first embodiment.

In addition, as shown in FIG. 26, a tunnel barrier layer 19 made of MgO or the like could be interposed between the source region 12 and the ferromagnetic metal $M_{s1}$, to prevent diffusion of metal atom from the source electrode into the semiconductor substrate 100. It may also contribute to avoiding spin de-polarization of the electrons during their transmission from the electrode into the semiconductor. Similar interlayer may be provided also between the drain region 14 and the ferromagnetic metals $M_{d1}$ and $M_{d2}$, although, in FIG. 26, the ferromagnetic metal $M_{d2}$ serving as the second drain electrode is not shown. (Reference numeral 16 in the figure indicates the gate insulating film.)

Of course, not only in this embodiment, but also in the second and third embodiments to be described later, tunnel barrier layers can be provided between the source electrode and the source region, and/or between the drain electrodes and the drain region.

Second Embodiment

Now, referring now to FIGS. 10A to 17, a spin-MOSFET in accordance with the second embodiment of the present invention is described.

The spin-MOSFET of this embodiment is the same as the spin-MOSFET of the first embodiment, except for having more than one source electrode.

[Manufacturing Procedure]

Below, exemplary manufacturing procedures of the spin-MOSFET are described, assuming an n-type MOSFET. Of course, a p-type MOSFET can be manufactured in the same manner, simply by reversing the conductivity type.

Figure 10A:
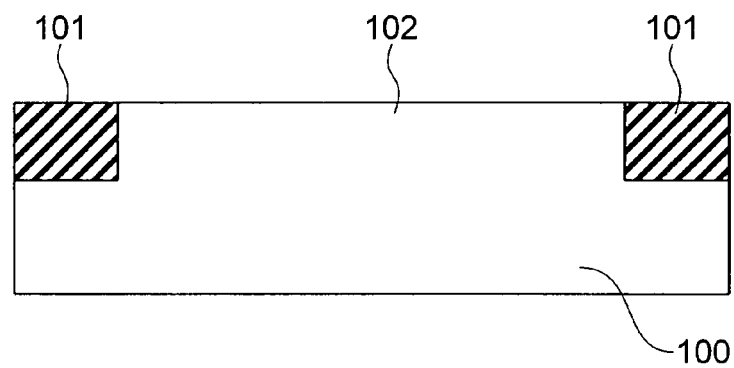
FIGS. 10A and 10B are cross-sectional views illustrating manufacturing procedures of a spin-MOSFET in accordance with a second embodiment.

First, as shown in FIG. 10A, shallow trenches are formed in the {100}-plane of a p-type silicon substrate 100 by using known techniques such as lithography and RIE (Reactive Ion Etching). Those shallow trenches are then filled up with an insulating material by CVD (Chemical Vapor Deposition) and successively planarized by CMP (Chemical Mechanical Polishing), so as to form STI (Shallow Trench Isolation) regions 101. The STI regions 101 are formed to surround each device region 102.

Figure 10B:
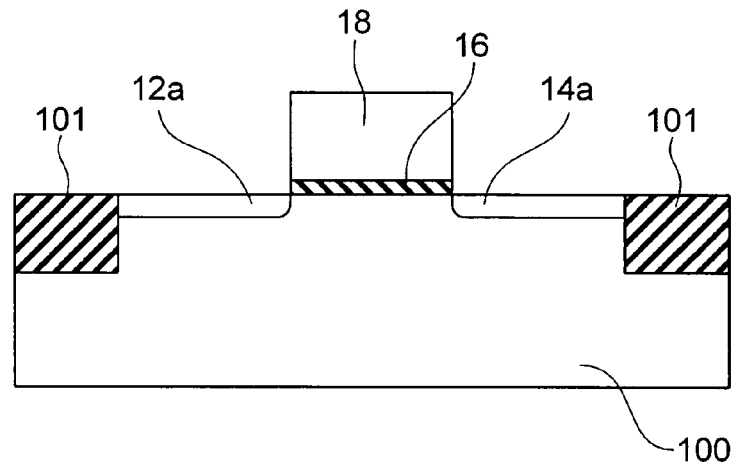

Next, as shown in FIG. 10B, a 5 nm-thick oxide film, for example, is formed as a gate insulating film on the device formation region 102 of the silicon substrate 100, by, e.g., thermal oxidation. Subsequently, a 200 nm-thick polysilicon film, for example, is deposited as a gate electrode material on the gate insulating film by, e.g., CVD. Then, the polysilicon film and the oxide film are patterned into the shapes of the gate electrode 18 and the gate insulator 16, by means of effective known techniques such as photolithography and RIE.

Using thus-formed gate electrode 18 as a mask, n-type impurities are then ion-implanted into the p-type silicon substrate 100, so as to form shallow n-type diffusion layers $12a$ $14a$ in the device formation region 102, adjacent to the gate electrode 18. These diffusion layers are to serve as extension regions of the source region and the drain region.

Figure 11:
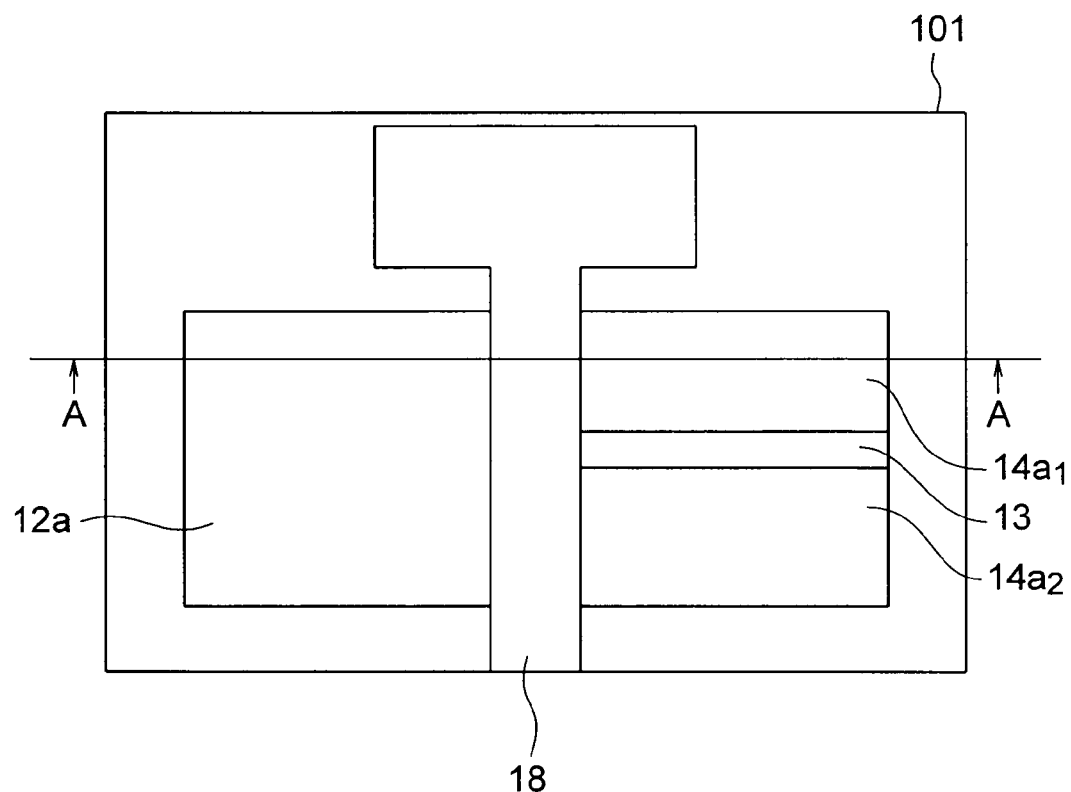
FIG. 11 shows a top view outline of the spin-MOSFET at one stage of the manufacturing of the spin-MOSFET in accordance with the second embodiment.

FIG. 11 shows a top view outline of the spin-MOSFET at this stage of the manufacturing. It should be understood that FIG. 10B is a cross-sectional view of the spin-MOSFET along the line A-A in FIG. 11.

As shown in FIG. 11, in fact, separate shallow diffusion layers $14a_1$ and $14a_2$ are formed by the implantation. Between the diffusion layers $14a_a$ and $14a_2$, a high-resistance region 13 is left without implantation. This high-resistance region 13 can be readily created by forming an appropriate photoresist mask over the region prior to the above-mentioned extension-producing implantation.

Figure 12:
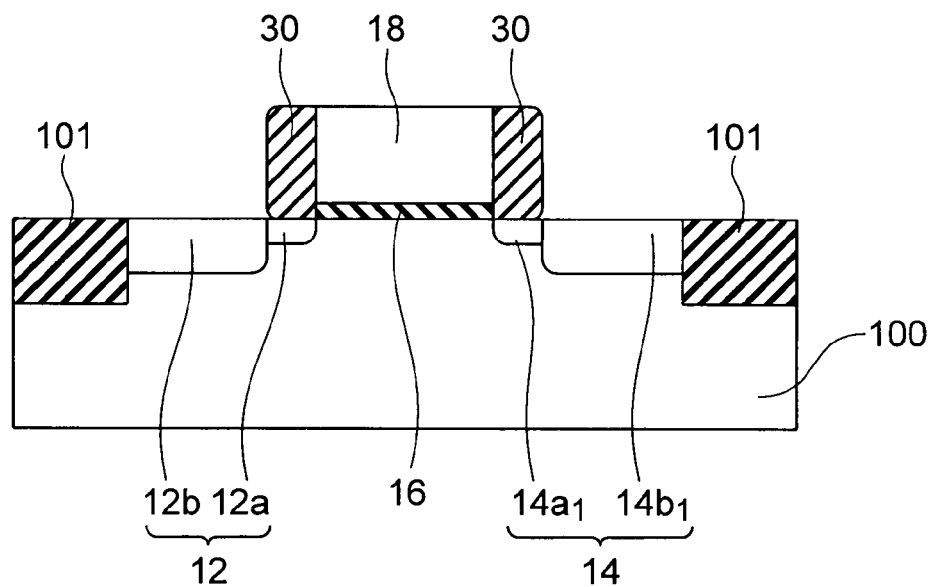
FIG. 12 is a cross-sectional view of the spin-MOSFET at one stage of the manufacturing of the spin-MOSFET in accordance with the second embodiment.

Next, as shown in FIG. 12, a 20 nm-thick silicon nitride film, for example, is conformaly deposited over the entire structure, by e.g., CVD. Subsequent anisotropic etching such as RIE leaves the silicon nitride gate sidewalls 30 on both sides of the gate electrode 18. After forming a photoresist mask over the high-resistance region 13, n-type impurities are again ion-implanted, so as to form deeper diffusion layer $12b$, $14b_1$, and $14b_2$ on both sides of the gate electrode 18. The diffusion layers $12b$, $14b_1$, and $14b_2$ are to serve as the source region and the drain region and have a higher impurity concentration than the extension regions $12a$, $14a_1$, and $14a_2$. Of course, the electrical impurities can be also introduced into the gate electrode 18 at this stage.

Figure 13:
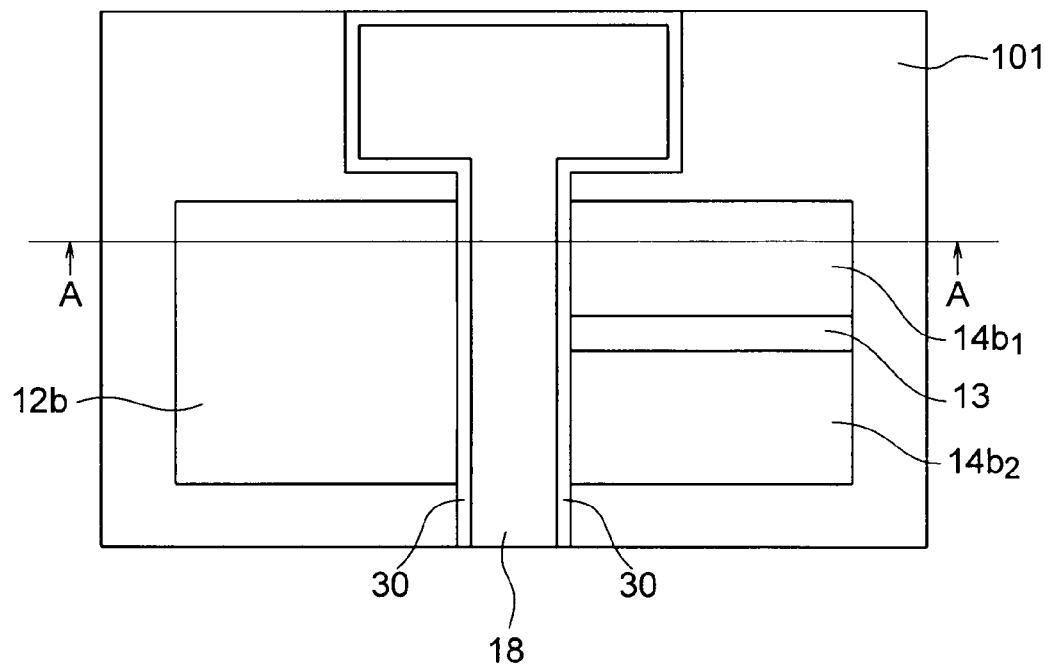
FIGS. 13 to 17 are top views illustrating the spin-MOSFET at various stage of the manufacturing in accordance with the second embodiment.

FIG. 13 shows a top view outline of the spin-MOSFET at this stage of the manufacturing. It should be understood that FIG. 12 is a cross-sectional view of the spin-MOSFET along the line A-A in FIG. 13. As shown in this figure, the diffusion layers $14b_1$ and $14b_2$ in the drain region are formed to sandwich the high-resistance region 13.

The implanted impurities are then electrically activated by RTA (i.e., Rapid Thermal Annealing). Resulting extension region $12a$ and the diffusion layer $12b$ constitute a source region 12. Likewise, the extension regions $14a_1$ and $14a_2$ and the diffusion layers $14b_1$ and $14b_2$ form a drain region 14. Needless to say, the same annealing can also make the ion-implanted gate electrode 18 electrically conductive.

Next, a photoresist mask having openings corresponding to the desired shapes and locations of source and drain electrodes are formed by lithography. A ferromagnetic metal is successively deposited over the structure by e.g., sputtering. Ensuing photoresist removal not only takes away the photoresist mask but also lifts-off the ferromagnetic metal deposited on top of the mask. Thus, only ferromagnetic metals in desired shapes are left directly on the source and drain regions as the electrodes.

Figure 14:
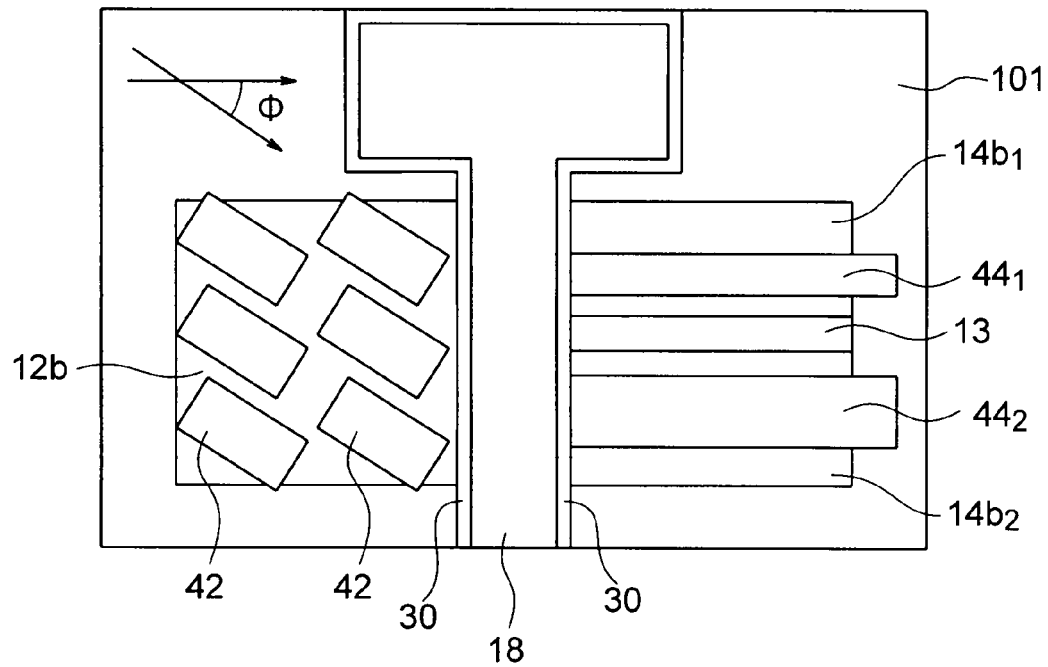

In this manner, as shown in a top view of FIG. 14 source electrodes 42 are formed on the source region 12, first drain electrodes $44_1$ is formed on the diffusion layer $14b_1$ of the drain region 14, and a second drain electrode $44_2$ is formed on the diffusion layer $14b_2$ of the drain region 14.

Of course, the ferromagnetic metal electrodes can be formed in other ways. For example, these electrodes can be formed utilizing a so-called conventional "contact-via" technique. In this technique, after an interlayer insulating film is deposited, contact holes are drilled through the interlayer down to the source and drain regions. The contact holes are then filled up with a ferromagnetic metal, so as to form the source and drain electrodes.

Here it should be mentioned that, since the respective ferromagnetic metals are formed on the heavily-doped source and drain regions, transmission of electrons between the metal electrodes and the semiconductor source and drain regions are greatly facilitated by the quantum mechanical tunneling effect, despite formation of the Schottky barrier between the semiconductor layer and the ferromagnetic metals.

Examples of the possible ferromagnetic electrodes include $Co_{40}Fe_{40}B_{20}$, $Co_2MnX$ (where, X represents an element such as Ga, Si, Al, Ge, Sn, or Sb), a Heusler alloy (i.e., half-metal) of $Co_2(Cr_yFe_{1-y})Al$ or $Co_2FeAl_ySi_{1-y}$ (where, y is a number between 0 to 1, representing atomic composition in the alloy), a NiFe alloy, and a CoFe alloy.

Of course, one can use mutually different ferromagnetic metals as the source electrodes 42, the first drain electrode $44_1$, and the second drain electrode $44_2$, respectively.

Further, an antiferromagnetic film made of FeMn, PtMn, NiMn, IrMn, NiO, $Fe_2O_3$, or the like may be stacked over the first drain electrode $44_1$ and the second drain electrode $44_2$, so as to firmly pin and stably fix the respective magnetization directions.

In addition, a tunnel barrier layer such as MgO could be interposed between the source region 12 and the ferromagnetic source electrodes 42, to prevent metal atom diffusion from the ferromagnetic electrodes into the semiconductor substrate 100. It will also contributes to avoid electron spin de-polarization during electron transmission through the metal-semiconductor interface. Similar interlayer may be provided also between the drain region 14 and the ferromagnetic electrodes $44_1$ and $44_2$.

Besides, metal layers containing Ta or Ru may be formed on tops of the source electrodes 42 and the first and second drain electrodes $44_1$ and $44_2$, or even in-between the ferromagnetic metals and the antiferromagnetic films.

In order to control the magnetization directions of the ferromagnetic electrodes, it is preferable that the ferromagnetic films are shaped into rectangles, with each longer side aligned in the desired magnetization direction. Due to demagnetization effect, the magnetization directions of the rectangular-shaped ferromagnetic films tend to align along the longer sides. In other words, the easy axis of magnetization of the rectangular-shaped ferromagnetic film runs along the longer side of the shape.

Of course, as shown in FIG. 14, the longer sides of the first drain electrode $44_1$ and the second drain electrode $44_2$ are made to run parallel to each other, and the longer side of each of the source electrodes 42 is set to form a fixed angle Φ with respect to those parallel directions. Although multiple parallel source electrodes 42 are utilized in this embodiment, as a matter of course, a single electrode may be employed as the source electrode 42, as in the first embodiment.

In order to further secure better and finer control of magnetization directions of the ferromagnetic electrodes, it is preferable that a ratio between the longer-side-length and shorter-side-length (i.e., the value obtained by dividing the length of the longer side by the length of the shorter side) of the first drain electrode $44_1$ is made larger than the corresponding ratio of each of the second drain electrode $44_2$ and the source electrodes 42. With this arrangement, the so-called "demagnetization coefficient" of the first drain electrode $44_1$ becomes smaller than those of the other electrodes. Similarly, the length ratio of the second drain electrode $44_2$ is better to exceed the ratio of each of the source electrodes 42, so that the demagnetization coefficient of the second drain electrode $44_2$ falls below the demagnetization coefficient of each of the source electrodes 42.

In general, a magnetic field required to magnetize a ferromagnetic electrode having a larger demagnetization coefficient is smaller than that required to magnetize a ferromagnetic electrode of a smaller demagnetization coefficient.

Figure 15:
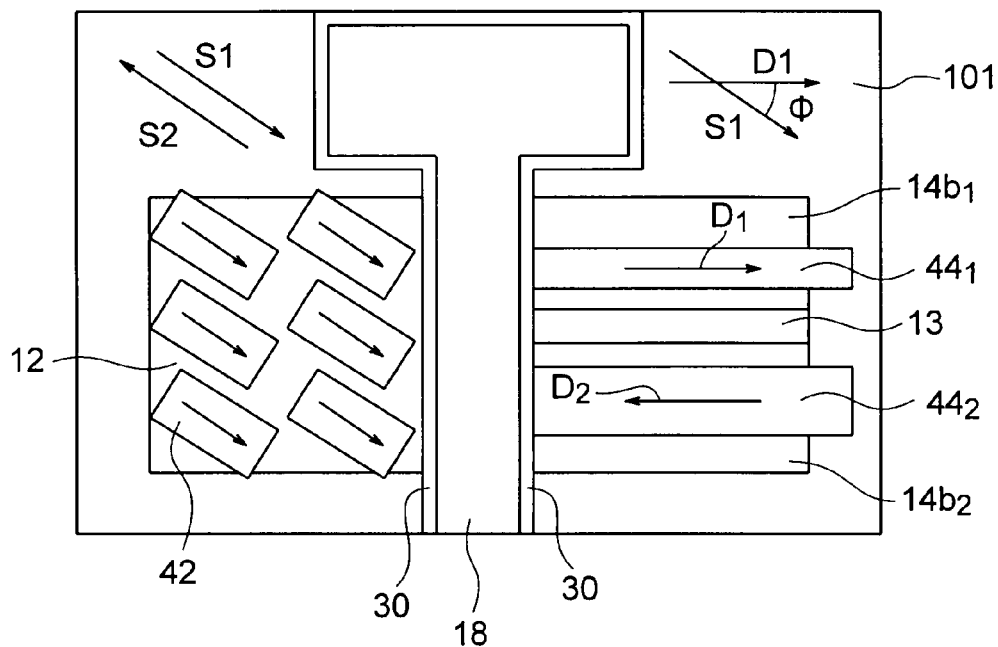

As a result, one can magnetize the first drain electrode $44_1$ of the smallest demagnetization coefficient along the direction D1 as in FIG. 15, by applying a largest magnetic field along the same direction. Subsequently, by applying a magnetic field large enough to switch the magnetization direction of $44_2$, but not large enough to flip the magnetization of $44_1$, the second drain electrode $44_2$ of larger demagnetization coefficient can be safely magnetized along the antiparallel direction D2 as in FIG. 15, without changing the magnetization direction of $44_1$. Finally, by applying a magnetic field just large enough to change only the magnetization direction of the source electrodes 42, but not large enough to influence the magnetization directions of the first and second drain electrodes $44_1$ and $44_2$, the magnetization direction of the source electrodes 42 (which have the largest demagnetization coefficient) can be selectively aligned along the direction S1 as in FIG. 15. In this manner, the magnetization configuration of electrodes as shown in FIG. 15 can be successfully realized.

It should be also mentioned here that the respective electrodes are preferably magnetized at appropriate temperatures for the individual electrodes. For example, a ferromagnetic metal stacked with an antiferromagnetic layer can be readily magnetized by performing the procedure at an elevated temperature around the Neel temperature of the antiferromagnetic layer. Thus, by forming different antiferromagnetic layers with distinct Neel temperatures over the respective ferromagnetic metal electrodes, each electrode can be efficiently and selectively magnetized at around the corresponding Neel temperature of its antiferromagnetic over-layer.

Otherwise, whereas the first drain electrode is chosen to be a single ferromagnetic layer, as a second drain electrode, one can employ a three-layer stack structure, namely, a ferromagnetic layer, a nonmagnetic layer, and a ferromagnetic layer, so as to develop antiferromagnetic coupling between the lower ferromagnetic layer and the upper ferromagnetic layer via the nonmagnetic inter-layer. In this case, if the upper ferromagnetic layer is magnetized along D1, the lower ferromagnetic layer comes to have a magnetization direction along the anti-parallel direction D2. When one further stacks identical antiferromagnetic layers over both the first and second drain electrodes and then magnetizes the ferromagnetic layer of the first drain electrode and the upper ferromagnetic layer of the second drain electrode along D1 at around the Neel temperature of the antiferromagnetic layers, the lower ferromagnetic layer of the second drain electrode can be automatically magnetized along D2. Because only the magnetization direction of the lower ferromagnetic layer matters in terms of the spin-MOSFET operation, the anti-parallel magnetization configuration of drain electrodes as shown in FIG. 15 can be successfully realized.

In terms of switching of the magnetization of the source electrodes 42, their larger-than-drain-electrodes demagnetization coefficients provide additional advantage of safe reversal of their magnetization directions from S1 to S2 in FIG. 15 and, vice versa, by means of small magnetic fields not affecting the magnetization directions of the drain electrodes.

In addition to the above dissimilar demagnetization coefficients of the electrodes, suppression of adverse demagnetizing fields and associated stabilization of the magnetization, thanks to the anti-parallel magnetization configuration of the drain electrodes, also contributes to highly selective magnetization switching only of the source electrodes.

Moreover, the anti-parallel magnetization configuration of the drain electrodes $44_1$ and $44_2$ can be further stabilized by providing a high-permeability material (such as a soft-magnetic material having relative magnetic permeability higher than 100, for example, Fe—Ni-alloy based permalloy) in-between the two electrodes in such a way to bridge the opposite magnetic charges appearing on the respective ends of the electrodes. As long as an electrical insulation between the electrodes is maintained, the operation of the spin-MOSFET stay intact, while the magnetization of the ferromagnetic metals of the first and second drain electrodes is more firmly fixed.

Figure 16:
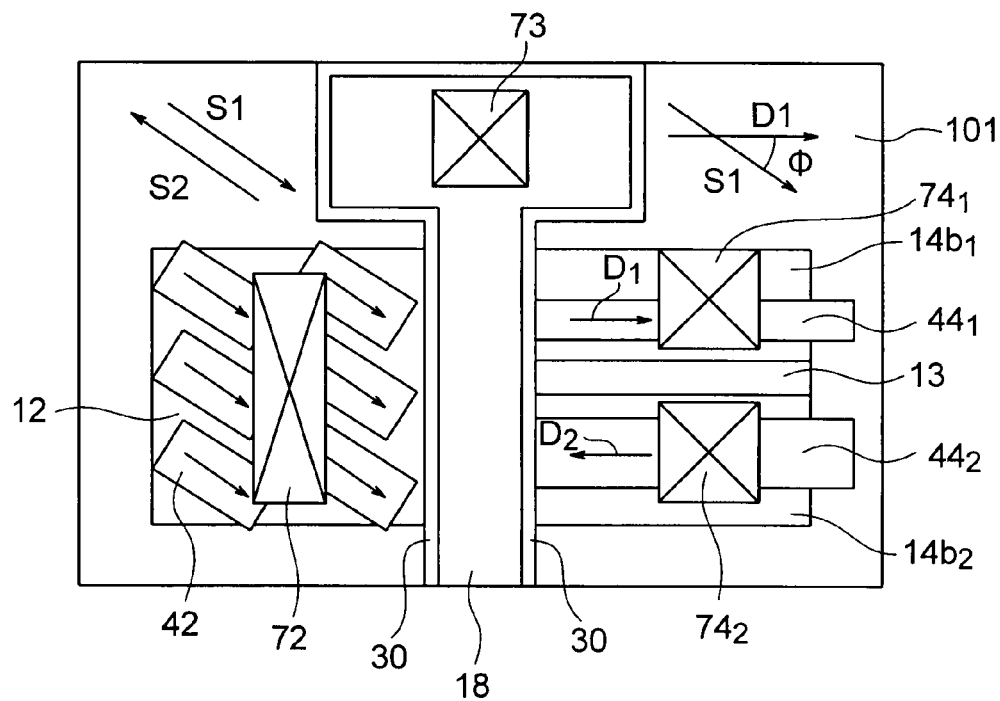

As a next manufacturing step after the completion of the structure shown in FIG. 15, an interlayer insulating film (not shown) is deposited, and contact holes down to the source electrodes 42, to the first and second drain electrodes $44_1$ and $44_2$, and to the gate electrode 18 are formed through the interlayer film, as shown in FIG. 16. The contact holes are then filled up with wiring metals such as Al or the like, so as to form electrical contacts 72, $74_1$, $74_2$, and 73. Subsequently, another interlayer film (not shown) is further deposited, and wiring metal (not shown) to the contacts are formed on the interlayer film.

Figure 17:
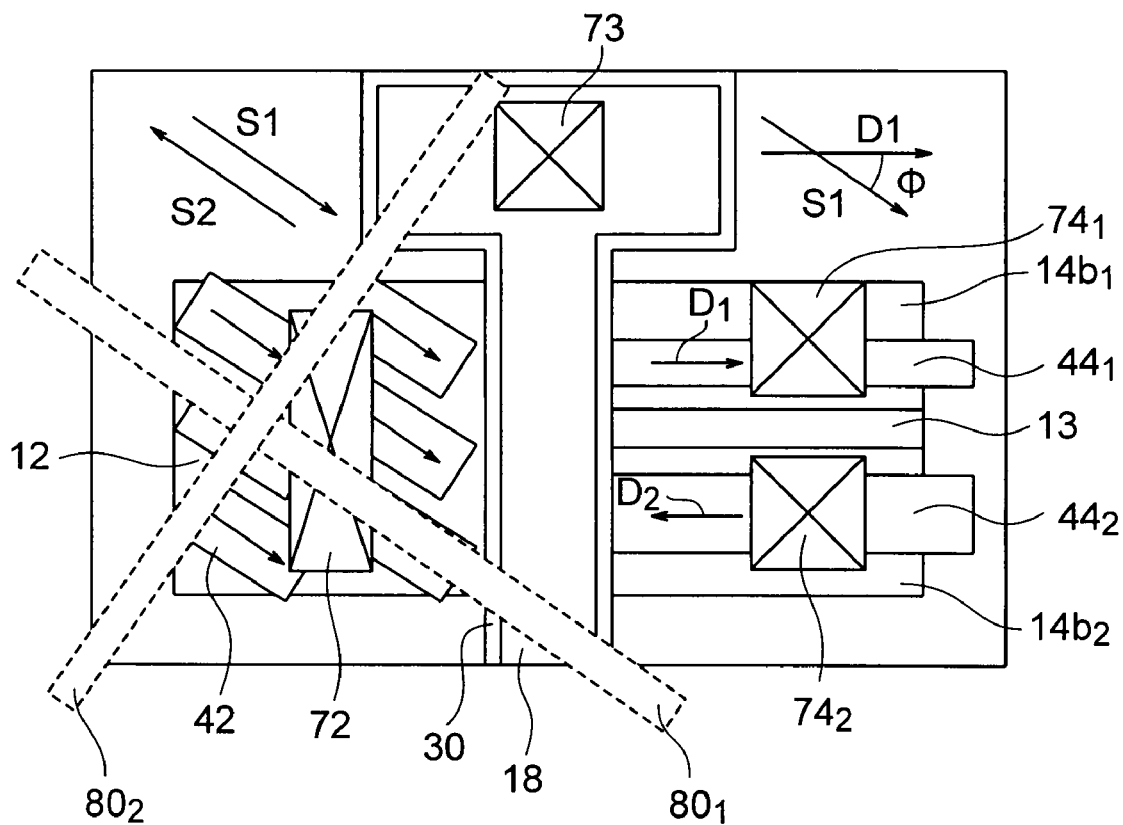

As shown in FIG. 17, if necessary, crossing wires $80_1$ and $80_2$ may be further formed over the source region 12, so as to change only the magnetization directions of the ferromagnetic source electrodes by appropriate magnetic fields generated from the electrical currents flowing the wires. The wire $80_1$ of the crossing wires is placed in the direction of the easy axis of magnetization of the ferromagnetic source electrodes, and the other wire $80_2$ is aligned perpendicular to that direction, or in other words, along the hard axis of magnetization.

By adjusting the intensity and direction of current pulses flowing through the pair of the crossing wires, the generated magnetic field can be made to switch only the magnetization directions of the source electrodes 42 around the crossing point. Thanks to the stable magnetization of the drain electrodes, the magnetization direction of the source electrodes can be safely and reliably switched from S1 to S2, or from S2 to S1, without changing the magnetization directions of the drain electrodes 44$_1$ and 44$_2$.

Finally, optional formation of additional multi-layered wiring, passivation of the structure by an insulator, dicing, and mounting to an appropriate package complete a semiconductor device.

[Magnetization Switching by Spin Injection]

Regarding the magnetization switching of the ferromagnetic source electrodes 42, a spin injection technique can, of course, be utilized, in stead of the above-explained magnetization reversal by magnetic fields.

Figure 27:
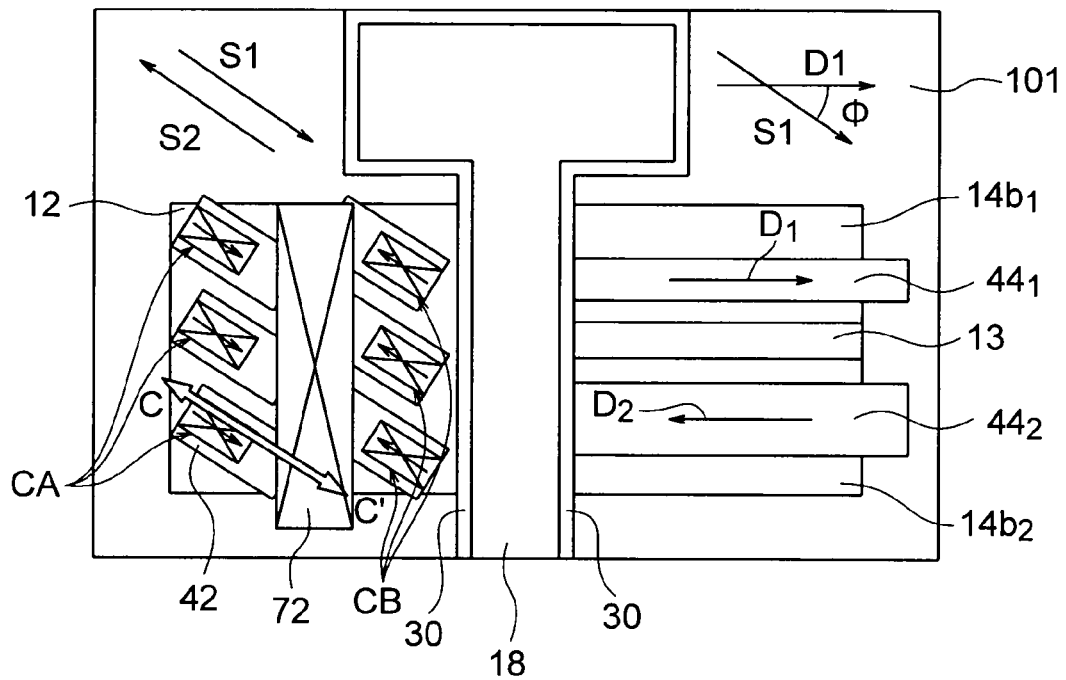
FIG. 27 is a top view outline of the spin-MOSFET in the second embodiment, explaining the magnetization reversing technique by spin injection into the source electrodes.

For example, additional contacts to the source electrodes may be formed by stacks of films CA and CB, which include conductive ferromagnetic layers with fixed-magnetization directions as shown in FIG. 27.

Figure 28:
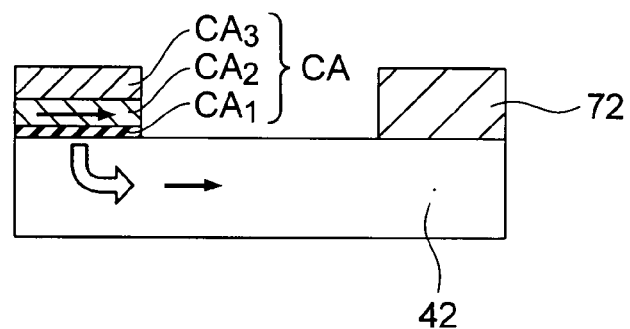
FIG. 28 is a cross-sectional view taken along the line C-C' of FIG. 27, explaining the magnetization reversing technique by spin injection into a source electrode.

Each of the CA stacks is made of a nonmagnetic layer $CA_1$ directly formed on the ferromagnetic source electrode 42, a conductive fixed-magnetization layer $CA_2$ formed thereon, and a top antiferromagnetic layer $CA_3$, as shown in FIG. 28. It should be understood that each of the CB stacks is likewise made of three layers of a nonmagnetic layer, a conductive fixed-magnetization layer thereon, and a top antiferromagnetic layer (not shown). The top antiferromagnetic layers are provided so as to fix the magnetization directions of the middle conductive layers in the stacks CA and CB along S1 and S2 directions, respectively.

By simply forcing electrical currents to flow from the contact 72 to CA and from CB to the contact 72 (i.e., forcing electrons to flow from CA to 72 and 72 to CB), the magnetization directions of the ferromagnetic source electrodes 42 can be aligned along S1 direction. Spin-polarized electrons injected from CA into the ferromagnetic source electrodes apply so-called "spin-torque" to the source electrodes. As a result, they are magnetized along the spin-polarization direction of the injected electrons (i.e., along S1). On the other hand, spin-polarized electrons unable to enter CB accumulate in the source electrodes and also apply spin-torque. As a result, the source electrodes are magnetized along the anti-parallel direction to the magnetization direction of the fixed-magnetization layer in CB (i.e., also along S1). Needless to say, in order to align the magnetization directions along S2, one should just reverse the direction of the electrical currents.

Obviously, above magnetization switching can also be achieved solely by forming CA on each and every source electrode. Of course, one can form both CA and CB on each and every source electrode for reliable magnetization reversal.

It should be also mentioned here that, the smaller the sizes of the magnetic materials are, the more efficient the magnetization reversals by means of the spin injection becomes.

[Basic Components of the Present Spin-MOSFET]

The spin-MOSFET structure realized here includes:

source electrodes 42 formed with ferromagnetic metals magnetized in the first direction on the source region 12 of an n-type MOSFET formed on the {100} plane of silicon;

and the first and second drain electrodes that are magnetized in directions that differ from the first direction and are antiparallel to each other, are placed on the drain region 14 physically at a distance from each other, with the high-resistance layer 13 being interposed in between, and are formed with ferromagnetic metals.

If one focuses on the current flowing into one drain electrode, the present spin-MOSFET behaves exactly like a type-2 spin-MOSFET by switching the magnetization of the source electrodes, without requiring an unstable magnetic channel semiconductor, much like a type-1 spin-MOSFET.

[Benefits of the Present Spin-MOSFET]

Now, the effects of this embodiment are iterated and listed below:

(A) Because the present spin-MOSFET behaves much like a type-2 spin-MOSFET, the present spin-MOSFET is very suitable for nonvolatile reconfigurable logic circuits.

(B) Because the present spin-MOSFET can be realized simply by forming ferromagnetic electrodes on the conventional MOS structure, the present spin-MOSFET retains manufacturing and operational compatibility with the conventional C-MOSFET circuits.

(C) Because the spin-polarized channel electrons injected from the source electrodes can always flow either into the first or the second drain electrode, undesirable charge accumulation around the drain region is avoided. The absence of the charge accumulation prevents temporal variation of electrostatic potential in the channel semiconductor and also suppresses unwanted spin-flips of the channel electrons induced by spin-dependent interactions with impurities or crystalline defects in the semiconductor or due to thermal perturbation. Therefore, a stable and reliable device operation can be obtained with the present spin-MOSFET.

(D) Because the extent of the magnetic modulation of the channel current depends only on the relative angles between the magnetization direction of the source electrodes and the magnetization directions of the drain electrodes, by appropriately placing the electrodes, the present spin-MOSFET can arbitrarily adjust the extent of the magnetic modulation, regardless of the materials used for the respective electrodes. Thus, the present spin-MOSFET provides a large latitude and additional degree of freedom in designing optimized reconfigurable circuits.

(E) Because the drain electrodes are magnetized in directions antiparallel to each other, the demagnetizing fields of these electrodes can be significantly reduced even though the two electrodes are placed in the close vicinity of each other in the drain region. Without adverse effects of the demagnetizing field, the magnetization of the drain electrodes is stable against external magnetic stimuli and remains steady even in unexpected thermal disturbances. This greatly contributes to highly selective magnetization switching only of the source electrodes, without changing the magnetization directions of the drain electrodes.

(F) Because of the high-permeability material in-between the ends of the two drain electrodes to bridge the opposite magnetic charges appearing on the respective ends of the electrodes, the anti-parallel magnetization configuration of the drain electrodes can be further stabilized. Thus, the present spin-MOSFET is capable of reliable switching of the device operation.

(G) Because the demagnetization coefficient of each source electrode is made larger than the demagnetization coefficients of the drain electrodes, the magnetization directions of the source electrodes can be safely reversed by small magnetic fields without affecting the magnetization directions of the drain electrodes.

(H) Because of the availability of a pair of the drain electrodes, to which electrically independent metal wires can be connected, additional versatility in realizing a new function by utilizing the nonvolatile magnetic modulation can be provided with the present spin-MOSFET.

(I) Because the respective ferromagnetic metals are formed on the heavily-doped source and drain regions, transmission of electrons between metal electrodes and the semiconductor source and drain regions are greatly facilitated by the quantum mechanical tunneling effect, despite formation of the Schottky barrier between the semiconductor layer and the ferromagnetic metals.

Therefore, the present spin-MOSFET readily realizes a spin-MOSFET suitable for nonvolatile reconfigurable logic circuits, which not only retains the manufacturing and operational compatibility with the conventional C-MOSFET circuits, but also is capable of stable and reliable device operation.

Third Embodiment

Now, referring to FIGS. 18A to 25, a semiconductor device in accordance with the third embodiment of the present invention is described.

The semiconductor device of this embodiment realizes a two-input inverter circuit that includes n-type spin-MOSFETs and p-type conventional MOSFETs formed on the {100}-plane of silicon. It not only serves as a reconfigurable logic element as shown in FIG. 3, but also functions as a nonvolatile memory as well.

[Manufacturing Procedure]

A method of manufacturing the semiconductor device of this embodiment is described below.

Figure 18A:
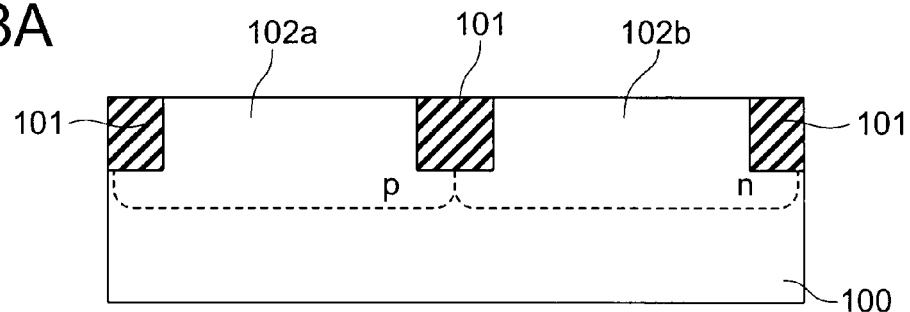
FIGS. 18A to 18C are cross-sectional views illustrating manufacturing procedures of a semiconductor device in accordance with a third embodiment.

First, as shown in FIG. 18A, shallow trenches are formed in the {100}-plane of a p-type silicon substrate 100 by using known techniques such as lithography and RIE. Those shallow trenches are then filled up with an insulating material by CVD and successively planarized by CMP, so as to form STI regions 101. The STI regions 101 are formed to surround a first device formation region 102a and also to enclose a second device formation region 102b. Of course, the first device formation region 102a and the second device formation region 102b are electrically isolated from each other by the STI regions 101.

Subsequently, by means of known processes such as an ion implantation and a thermal treatment, a p-type well and an n-type well are formed in the first and second device formation regions 102a and 102b, respectively.

Figure 18B:
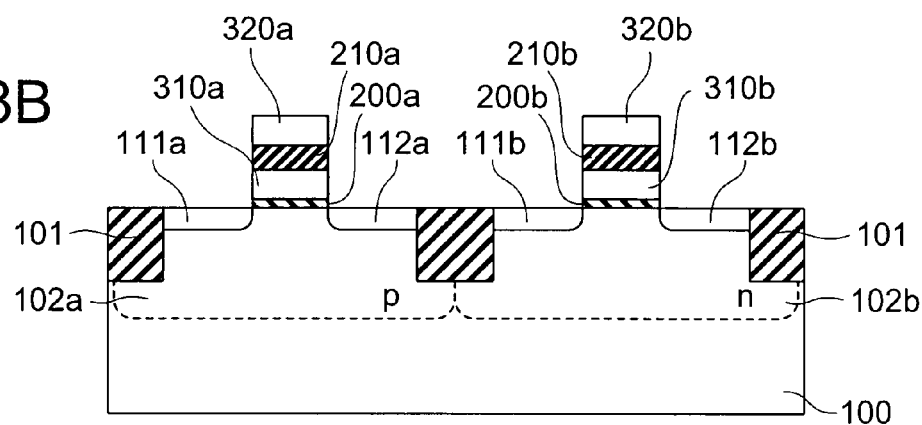

Next, as shown in FIG. 18B, a 5 nm-thick oxide film, for example, is formed as a gate insulating film on both the first and second device formation regions 102a and 102b, by e.g., thermal oxidation. Ensuing blanket CVD deposition of a 200 nm-thick polysilicon film (i.e., first polysilicon film), for example, provides a floating gate material over the gate insulating film.

After the formation of the first polysilicon film, a photoresist is then patterned to mask either one of the well regions. Impurities of the opposite conductivity-type from that of unmasked well region are implanted into the exposed area of the polysilicon film. The complementary doping of the polysilicon film is also repeated for the other well region as well. Subsequently, the implanted impurities are thermally activated.

Then, a silicon nitride film of 10 nm in film thickness, for example, is deposited over the first polysilicon film as a block insulating film 210 by a known technique such as CVD. A second polysilicon film of 100 nm in film thickness, for example, is further deposited as a control gate material film by a known technique such as CVD.

Next, the second polysilicon film and the block insulating film are patterned into the shapes of a control gate electrode 320a and a block insulator 210a on the p-type well region 102a, as well as a control gate electrode 320b and a block insulator 210b on the n-type well region 102b, by means of effective known techniques such as photolithography and RIE. The control gate 320a and the control gate 320b are processed so as to form independent and isolated electrodes located physically at a distance from each other.

Likewise, the first polysilicon film and the gate insulating film are patterned into the shapes of a floating gate electrode 310a and a gate insulator 200a on the p-type well region 102a, as well as a floating gate electrode 310b and a gate insulator 200b on the n-type well region 102b, by means of effective known techniques such as photolithography and RIE. The floating gate 310a and the floating gate 310b are processed so as to retain physical connection over the STI region 101.

After forming photoresist masks of appropriate patterns and also using thus-formed gate electrodes as masks, conductive impurities are ion-implanted into the silicon substrate 100, so as to form shallow diffusion layers, 111a, 112a, 111b, and 112b that will serve as source and drain extension regions. Of course, the diffusion layers 111a and 112a are of the n-type, and the diffusion layers 111b and 112b are of the p-type. FIG. 18B is a cross-sectional view of the semiconductor device at this stage of the manufacturing.

Here, it should be remembered that, although the floating gate electrodes 310a and 310b are drawn separately in this cross-sectional view, they are actually singly-connected on the STI isolation region behind the cross-sectional plane, as will be explained below.

Figure 18C:
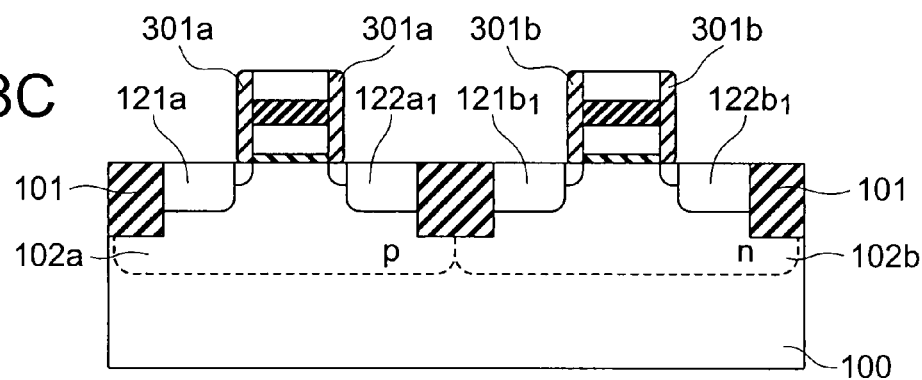

Next, as shown in FIG. 18C, a 20 nm-thick silicon nitride film, for example, is then conformaly deposited over the structure, by e.g., CVD. Subsequent anisotropic etching such as RIE leaves the silicon nitride gate sidewalls 301a and 301b on both sides of control gate electrodes 320a and 320b.

After forming photoresist masks of appropriate patterns, conductive impurities are again ion-implanted into the silicon substrate 100, so as to form deeper diffusion layers, 121a, 122$a_1$, 121$b_1$, and 122$b_1$ that will serve as source and drain regions. The diffusion layers 121a and 122$a_1$ are of the n-type, and made to have higher impurity concentration than the extension regions 111a and 112a. The diffusion layers 121$b_1$ and 122$b_1$ are of the p-type, and made to have higher impurity concentration than the extension regions 111b and 112b.

By the same implantation, impurities of the opposite conductivity types from those of the respective well regions are also implanted into the control gate electrodes 320a and 320b.

The implanted impurities are then electrically activated by RTA. The resulting diffusion layers 121a, 122$a_1$, 121$b_1$, and 122$b_1$ are adjusted to have a depth of 80 nm measured from the surface of the silicon semiconductor substrate 100, for example.

Figure 19:
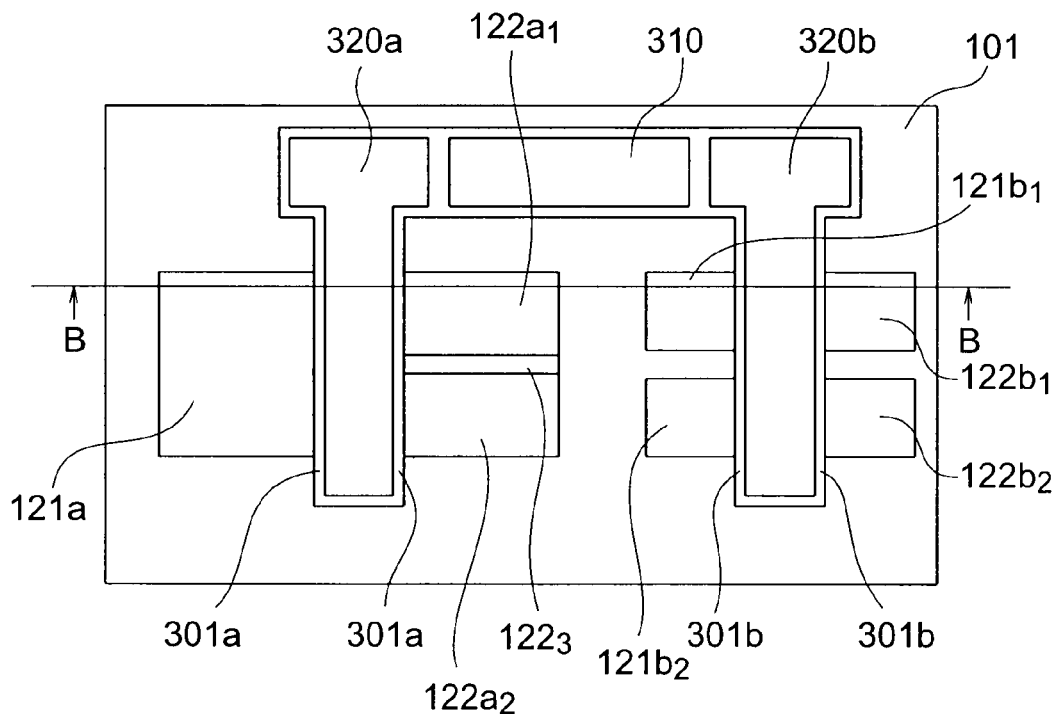
FIGS. 19 to 22 are top views illustrating the semiconductor device at various stage of the manufacturing in accordance with the third embodiment.

FIG. 19 shows a top view outline of the semiconductor device at this stage of the manufacturing. It should be understood that FIGS. 18A to 18C are cross-sectional views of the semiconductor device along the line B-B of FIG. 19.

As shown in FIG. 19, actually, separate diffusion layers 122$a_2$ and 122$a_1$ are formed in the drain region of the n-type spin-MOSFET by the ion implantation, to sandwich a high-resistance region 122$_3$, which is spared from the implantation. This high-resistance region 122$_3$ can be readily created by forming an appropriate photoresist mask prior to the implantation. On the diffusion layers 122$a_2$ and 122$a_1$, first and second drain ferromagnetic metals will be respectively formed.

It should be also understood that, other than the first p-type MOSFET described in the above cross-sectional views, a second p-type MOSFET is actually formed in parallel with the first p-type MOSFET. The second p-type MOSFET shares the control gate electrode 320b and the floating gate electrode 310b with the first p-type MOSFET. The second p-type MOSFET has source and drain diffusion layers 121b$_2$ and 122b$_2$, just like the diffusion layers 121b$_1$ and 122b$_1$ in the first p-type MOSFET.

Also evident from the figure is the extension of the floating gate electrode 310 over the STI region, connecting the floating gate electrode 310a over the n-type spin-MOSFET and the floating gate electrode 310b over the p-type MOSFETs. There are neither control gate materials nor block insulator films on the floating gate electrode 310 over the STI region 101. Its top surface is exposed.

As a next step, a carbon film, for example, is formed only above the source and drain regions of the n-type spin-MOSFET by means of lithography, RIE, CMP, and the likes. Subsequently, a 12-nm-thick silicidation metal, such as Ni, is formed over the entire surface by a known technique such as sputtering. Optionally, a cap layer, such as Ti or TiN, may be further deposited on the silicidation metal. Ensuing RTA in nitrogen at 450° C. for 30 seconds, for example, prompts selective silicidation reaction between Ni and Si, only where Ni is in direct physical contact with Si. Then, the unreacted Ni is selectively removed by wet-etching in a mixed solution of sulfuric acid and hydrogen peroxide. The remaining carbon film over the source and drain regions of the n-type spin-MOSFET is also selectively removed by an oxygen plasma, for example.

Figure 20:
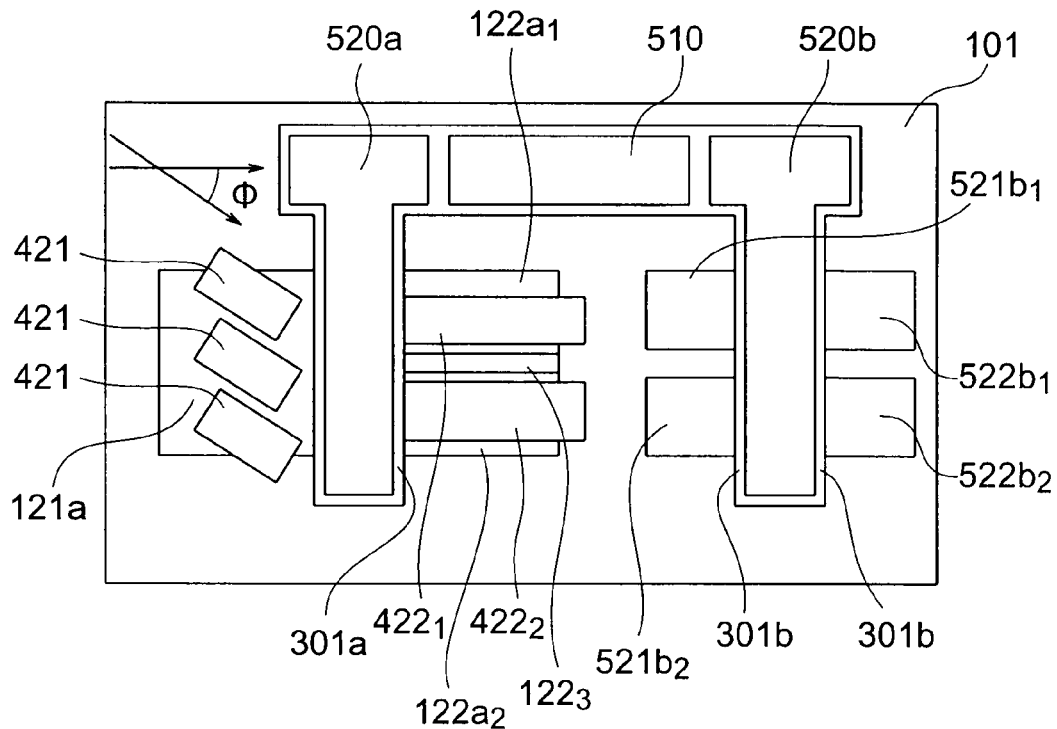

As a result, NiSi layers 521b$_1$ and 522b$_1$ are respectively formed on the diffusion layers 121b$_1$ and 122b$_1$ of the first p-type MOSFET. Likewise, NiSi layers 521b$_2$ and 522b$_2$ are respectively formed on the diffusion layers 121b$_2$ and 122b$_2$ of the second p-type MOSFET, as shown in FIG. 20. Also, NiSi layers 520a, 520b, and 510 are respectively formed on the control gate electrodes 320a and 320b, and on the floating gate electrode 310 over the STI region.

Here, it should be noted that, the NiSi layer 510 formed over the floating gate electrode 310 secures a sufficient electric connection between the floating gate electrodes 310a and 310b. This is an important attribute of the NiSi layer 510. Although the floating gate electrodes are connected physically by the floating gate electrode 310 over the STI region 101, it may not enough to establish an excellent electric connection between the floating gate electrodes, because they are doped to the opposite types of conductivity. Thus, the formation of the NiSi layer 510 provides a great advantage for establishing an excellent electric connection between these two floating gate electrodes.

Next, a photoresist mask having openings corresponding to the desired shapes and locations of source and drain electrodes of the n-type spin-MOSFET are formed by lithography. A ferromagnetic metal is successively deposited over the structure by e.g., sputtering. Ensuing photoresist removal not only takes away the photoresist mask but also lifts-off the ferromagnetic metal deposited on top of the mask. Thus, only ferromagnetic metals in desired shapes are left directly on the source and drain regions as the electrodes.

In this manner, as also shown in FIG. 20, ferromagnetic source electrodes 421 are formed on the source region, a first ferromagnetic drain electrode 422$_1$ is formed over the diffusion layer 122a$_1$, and a second ferromagnetic drain electrode 422$_2$ is formed over the diffusion layer 122a$_2$ of the n-type spin-MOSFET.

Of course, the ferromagnetic metal electrodes can be formed in other ways. For example, these electrodes can be formed utilizing a so-called conventional "contact-via" technique. In this technique, after an interlayer insulating film is deposited, contact holes are drilled through the interlayer down to the source and drain regions. The contact holes are then filled up with a ferromagnetic metal, so as to form the source and drain electrodes.

Also, since the respective ferromagnetic metals are formed on the heavily-doped source and drain regions, transmission of electrons between the metal electrodes and the semiconductor source and drain regions are greatly facilitated by the quantum mechanical tunneling effect, despite formation of the Schottky barrier between the semiconductor layer and the ferromagnetic metals.

Examples of the possible ferromagnetic electrodes include $Co_{40}Fe_{40}B_{20}$, $CO_2MnX$ (where, X represents an element such as Ga, Si, Al, Ge, Sn, or Sb), a Heusler alloy (i.e., half-metal) of $Co_2(Cr_yFe_{1-y})Al$ or $Co_2FeAl_ySi_{1-y}$ (where, y is a number between 0 to 1, representing atomic composition in the alloy), a NiFe alloy, and a CoFe alloy.

Evidently, one can use mutually different ferromagnetic metals as the source electrodes, the first drain electrode, and the second drain electrode, respectively.

Further, an antiferromagnetic film made of FeMn, PtMn, NiMn, IrMn, NiO, $Fe_2O_3$, or the like may be stacked over the first drain electrode and the second drain electrode, so as to firmly pin and stably fix the respective magnetization directions.

In addition, a tunnel barrier layer such as MgO could be interposed between the source region and the ferromagnetic source electrodes, to prevent metal atom diffusion from the ferromagnetic electrodes into the semiconductor substrate. It will also contributes to avoid electron spin de-polarization during electron transmission through the metal-semiconductor interface. Similar interlayer may be provided also between the drain region and the ferromagnetic electrodes.

Besides, metal layers containing Ta or Ru may be formed on tops of the source electrodes and the first and second drain electrodes, or even in-between the ferromagnetic metals and the antiferromagnetic films.

In order to control the magnetization directions of the ferromagnetic electrodes, it is preferable that the ferromagnetic films are shaped into rectangles, with each longer side aligned in the desired magnetization direction. Due to demagnetization effect, the magnetization directions of the rectangular-shaped ferromagnetic films tend to align along the longer sides. In other words, the easy axis of magnetization of the rectangular-shaped ferromagnetic film runs along the longer side of the shape.

Of course, as shown in FIG. 20, the longer sides of the first drain electrode 422$_1$ and the second drain electrode 422$_2$ are made to run parallel to each other, and the longer side of each of the source electrodes 421 is set to form a fixed angle Φ with respect to those parallel directions. Although multiple parallel source electrodes are utilized in this embodiment, as a matter of course, a single electrode may be employed as the source electrode, as in the first embodiment.

Moreover, in order to secure better and finer control of magnetization directions of the ferromagnetic electrodes, it is preferable that a ratio between the longer-side-length and shorter-side-length (i.e., the value obtained by dividing the length of the longer side by the length of the shorter side) of the first drain electrode 422$_1$ is made larger than the corresponding ratio of each of the second drain electrode 422$_2$ and the source electrodes 421. With this arrangement, the so-called "demagnetization coefficient" of the first drain electrode $422_1$ becomes smaller than those of the other electrodes. Similarly, the length ratio of the second drain electrode $422_2$ is better to exceed the ratio of each of the source electrodes 421, so that the demagnetization coefficient of the second drain electrode $422_2$ falls below the demagnetization coefficient of each of the source electrodes $42_1$.

In general, a magnetic field required to magnetize a ferromagnetic electrode having a larger demagnetization coefficient is smaller than that required to magnetize a ferromagnetic electrode of a smaller demagnetization coefficient.

Figure 21:
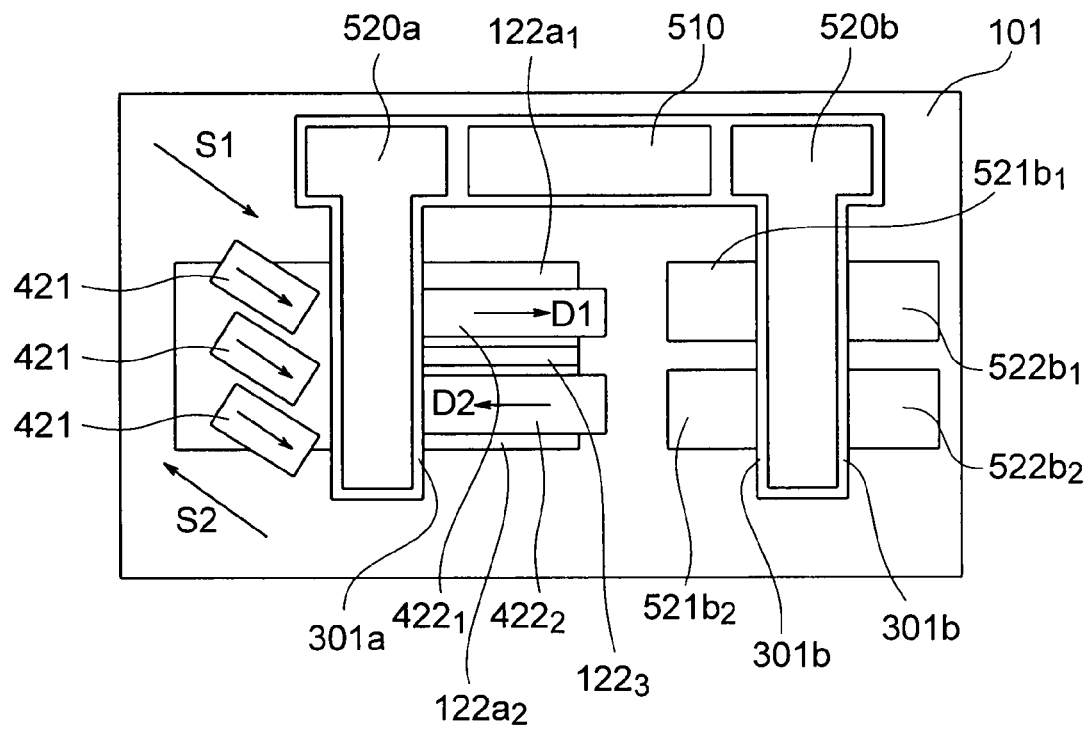

As a result, one can magnetize the first drain electrode $422_1$ of the smallest demagnetization coefficient along the direction D1 as in FIG. 21, by applying a largest magnetic field along the same direction. Subsequently, by applying a magnetic field large enough to switch the magnetization direction of $422_2$, but not large enough to flip the magnetization of $422_1$, the second drain electrode $422_2$ of larger demagnetization coefficient can be safely magnetized along the antiparallel direction D2 as in FIG. 21, without changing the magnetization direction of $422_1$. Finally, by applying a magnetic field just large enough to change only the magnetization direction of the source electrodes 421, but not large enough to influence the magnetization directions of the first and second drain electrodes $422_1$ and $422_2$, the magnetization direction of the source electrodes 421 (which have the largest demagnetization coefficient) can be selectively aligned along the direction S1 as in FIG. 21. In this manner, the magnetization configuration of electrodes as shown in FIG. 21 can be successfully realized.

It should be also mentioned here that the respective electrodes are preferably magnetized at appropriate temperatures for the individual electrodes. For example, a ferromagnetic metal stacked with an antiferromagnetic layer can be readily magnetized by performing the procedure at an elevated temperature around the Neel temperature of the antiferromagnetic layer. Thus, by forming different antiferromagnetic layers with distinct Neel temperatures over the respective ferromagnetic metal electrodes, each electrode can be efficiently and selectively magnetized at around the corresponding Neel temperature of its antiferromagnetic over-layer.

Otherwise, whereas the first drain electrode is chosen to be a single ferromagnetic layer, as a second drain electrode, one can employ a three-layer stack structure, namely, a ferromagnetic layer, a nonmagnetic layer, and a ferromagnetic layer, so as to develop antiferromagnetic coupling between the lower ferromagnetic layer and the upper ferromagnetic layer via the nonmagnetic inter-layer. In this case, if the upper ferromagnetic layer is magnetized along D1, the lower ferromagnetic layer comes to have a magnetization direction along the anti-parallel direction D2. When one further stacks identical antiferromagnetic layers over both the first and second drain electrodes and then magnetizes the ferromagnetic layer of the first drain electrode and the upper ferromagnetic layer of the second drain electrode along D1 at around the Neel temperature of the antiferromagnetic layers, the lower ferromagnetic layer of the second drain electrode can be automatically magnetized along D2. Because only the magnetization direction of the lower ferromagnetic layer matters in terms of the spin-MOSFET operation, the anti-parallel magnetization configuration of drain electrodes as shown in FIG. 21 can be successfully realized.

In terms of switching of the magnetization of the source electrodes 421, their larger-than-drain-electrodes demagnetization coefficients provide additional advantage of safe reversal of their magnetization directions from S1 to S2 in FIG. 21 and, vice versa, by small magnetic fields without affecting the magnetization directions of the drain electrodes.

In addition to the above dissimilar demagnetization coefficients of the electrodes, suppression of adverse demagnetizing fields and associated stabilization of the magnetization, thanks to the anti-parallel magnetization configuration of the drain electrodes, also contributes to highly selective magnetization switching only of the source electrodes.

Moreover, the anti-parallel magnetization configuration of the drain electrodes $422_1$ and $422_2$ can be further stabilized by providing a high-permeability material (such as a soft-magnetic material having relative magnetic permeability higher than 100, for example, Fe—Ni-alloy based permalloy) in-between the two electrodes in such a way to bridge the opposite magnetic charges appearing on the respective ends of the electrodes. As long as an electrical insulation between the electrodes is maintained, the operation of the spin-MOSFET stay intact, while the magnetization of the ferromagnetic metals of the first and second drain electrodes is more firmly fixed.

Figure 22:
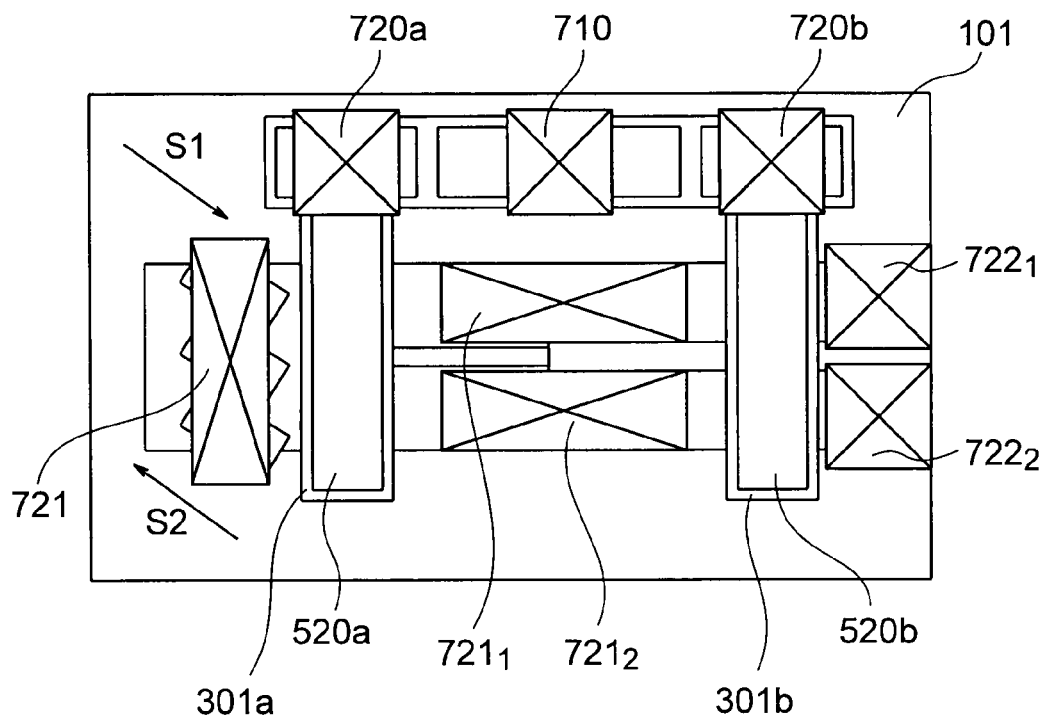

As a next manufacturing step after FIG. 21, an interlayer insulating film (not shown) is deposited, and contact holes through the interlayer film are formed. The contact holes are then filled up with wiring metals such as Al or the like, so as to form electrical contacts. As a result, the following contacts are established as shown in FIG. 22, namely, a contact 721 to the source electrode 421 of the n-type spin-MOSFET; a common contact $721_1$ to both the first drain electrode $422_1$ of the n-type spin-MOSFET and the NiSi layer $521b_1$ over the drain region of the first p-type MOSFET; a common contact $721_2$ to both the second drain electrode $422_2$ of the n-type spin-MOSFET and the NiSi layer $521b_2$ over the drain region of the second p-type MOSFET; a contact $722_1$ to the NiSi layer $522b_1$ over the source region of the first p-type MOSFET; a contact $722_2$ to the NiSi layer $522b_2$ over the source region of the second p-type MOSFET; a contact 720a to the NiSi layer 520a on the control gate electrode 320a; a contact 720b to the NiSi layer 520b on the control gate electrode 320b; and a contact 710 to the NiSi layer 510 on the floating gate electrode 310.

As described in the second embodiment, if necessary, crossing wires may be further formed over the source region of the n-type spin-MOSFET, so as to change only the magnetization directions of the ferromagnetic source electrodes by magnetic fields generated from electrical currents flowing the wires.

Finally, optional formation of additional multi-layered wiring, passivation of the structure by an insulator, dicing, and mounting to an appropriate package complete a semiconductor device.

[Magnetization Switching]

In case that the crossing wires are formed over the source region, by adjusting the intensity and direction of current pulses flowing through the pair of the crossing wires, the generated magnetic field can be made to switch only the magnetization directions of the source electrodes 421 around the crossing point. Thanks to the stable magnetization of the drain electrodes, the magnetization direction of the source electrodes can be safely and reliably switched from S1 to S2, or from S2 to S1, without changing the magnetization directions of the drain electrodes.

In stead of the above-explained magnetization reversal by magnetic fields, of course, the spin injection technique can be utilized for the magnetization switching of the ferromagnetic source electrodes 421. For example, as explained in the second embodiment, stacks of films including conductive ferromagnetic layers with fixed-magnetization along S1 and S2 may be formed on the source electrodes. The fixed-magnetization layers are formed on the source electrodes via nonmagnetic layers and electrically isolated from each other. By forcing electron currents to flow into the source electrodes from the layers with fixed-magnetization along S1, the magnetization directions of the source electrodes can be aligned along S1 direction. On the other hand, by forcing electron currents to flow from the layers with fixed-magnetization along S2, the magnetization directions of the source electrodes can be aligned along S2 direction.

[Basic Application of the Present Spin-MOSFET]

In order to use this semiconductor device as a two-input inverter of the reconfigurable circuit shown in FIG. 3, the contact 721 should be held at the ground level GND, while the contacts $722_1$ and $722_2$ are held at the supply voltage $V_{DD}$. The contacts 720a and 720b can be used as the input terminals A and B. An output equivalent to $V_{O1}$ in FIG. 3 is obtained from either one of the contacts $721_1$ and $721_2$.

Here, it should be noted that complementary output levels appear on the contacts $721_1$ and $721_2$. Thanks to the presence of the high-resistance region $122_3$ between the first drain electrodes $422_1$ and the second drain electrodes $422_2$, the respective electrodes can have different electrical potentials. On the other hand, a single effective potential, which is determined by the potential distribution in the drain region, regulates the injection of spin-polarized electrons from the source electrode. Thus, by reversing the magnetization directions of the source electrodes, these output levels of the contacts $721_1$ and $721_2$ come to be interchanged.

It should be also remembered that, in a small-sized device, ballistic transport of injected electrons dominates throughout the channel region down to the drain electrodes. Thus, these energetic electrons reaching the drain region can always flow either one of the drain electrodes, regardless of the potential of the respective electrodes.

Accordingly, undesirable accumulation of admission-rejected charges around the drain region can be avoided. The absence of the charge accumulation prevents temporal variation of electrostatic potential in the channel semiconductor and also suppresses unwanted spin-flips of the channel electrons induced by spin-dependent interactions with impurities or crystalline defects in the semiconductor or due to thermal perturbation. Therefore, stable and reliable device operation suitable for mass production can be obtained with the present spin-MOSFET.

It should be also emphasized that, as the contacts $721_1$ and $721_2$ can have complementary outputs, this device can be used as a nonvolatile SRAM memory, as well.

For such a purpose, the contact 721 should be held at the ground level GND, while the contacts $722_1$ and $722_2$ are held at the supply voltage $V_{DD}$. The contact 710 is used as an input terminal. When a voltage approximately half the supply voltage $V_{DD}$ is applied to the contact 710, complementary outputs depending on the magnetization direction of the source electrodes, in other words, the information stored in the memory, can be obtained at the contacts $721_1$ and $721_2$. Since the device is of a nonvolatile type, the data in the memory (i.e., the complementary outputs) can be always retrieved whenever required by simply applying the supply voltage to the contacts $722_1$ and $722_2$ only during the period of data reading. Because it obviates constant power supply to the memory, an increase in power consumption can be easily avoided.

Therefore, the present spin-MOSFET readily realizes a circuit which not only serves as a reconfigurable logic element as shown in FIG. 3, but also functions as a nonvolatile memory as well.

Without need for an unstable magnetic channel semiconductor, the present circuit retains the manufacturing and operational compatibility with the conventional C-MOSFET circuits.

In addition, because the present spin-MOSFET can avoid undesirable charge accumulation around the drain region, stable and reliable device operation can be obtained with the present spin-MOSFET.

Although, the first and second p-type MOSFETs are connected to the first and second drain electrodes of the spin-MOSFET in this embodiment, some other semiconductor device (such as a resistive element) may be connected to the first and/or second drain electrodes of the spin-MOSFET, instead.

Additional Comments Regarding the Embodiments

The following are additional comments regarding the first through third embodiments.

[On Drain Electrodes]

Figure 23:
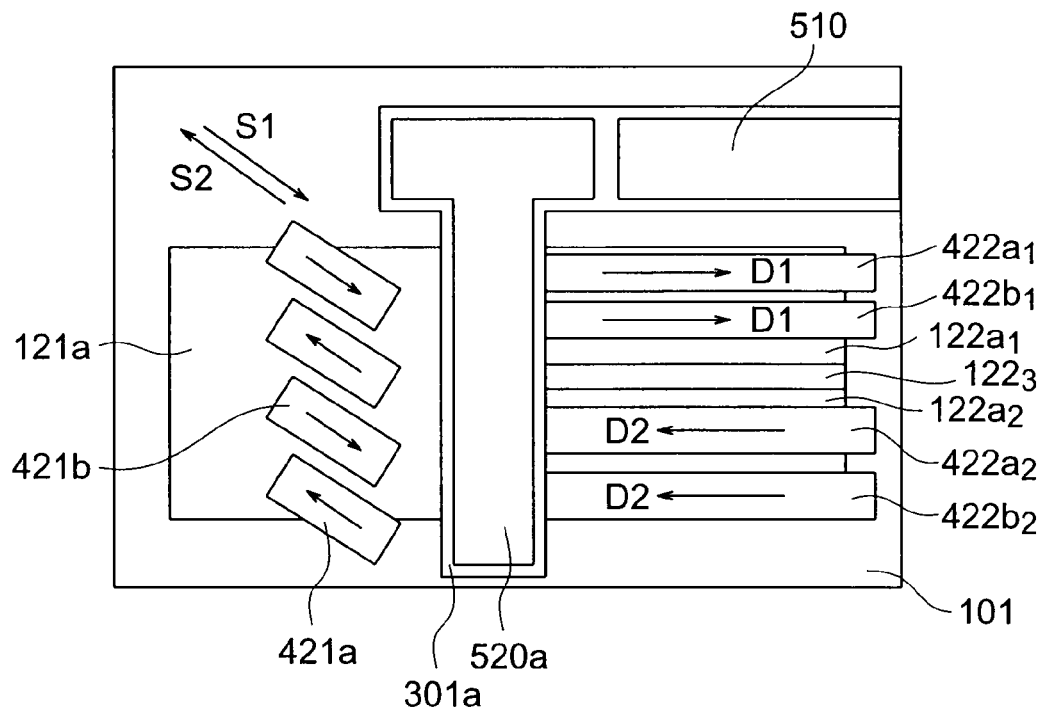
FIG. 23 is a top view outline of a semiconductor device in accordance with a first modification of the third embodiment.

In the first through third embodiments, only two ferromagnetic metals magnetized in directions antiparallel to each other are formed on the drain region. However, as shown in FIG. 23, there may be three or more ferromagnetic drain electrodes. As long as an antiparallel magnetization configuration is realized by the drain electrodes, the principle of present invention can be applied.

For example, a first set of ferromagnetic drain electrodes $422a_1$ and $422b_1$ magnetized along the D1 direction may be formed on the drain region $122a_1$, and a second set of ferromagnetic drain electrodes $422a_2$ and $422b_2$ magnetized along the D2 direction may be formed on the drain region $122a_2$.

Strictly speaking, the magnetization in each ferromagnetic drain electrode is not necessarily aligned in a mathematically perfect manner. From a microscopic point of view, there may be a local fluctuation in the magnetization direction, especially at the both ends of the ferromagnetic electrode.

Nonetheless, as long as the average magnetization directions of the electrodes are made antiparallel, the effects of the present invention still hold. This is because, in such a magnetization configuration, a couple of portions magnetized in antiparallel directions can be always found in the antiparallel pair of the electrodes. Therefore, the basic principle of the present invention effectively stays intact.

It should be also mentioned here that the average magnetization directions of the electrodes can be readily controlled by simply adjusting the shapes of the electrodes. In addition, by devising an appropriate shape for each ferromagnetic electrode, such as reducing the width of its end portions, the local fluctuation of the magnetization direction can be greatly suppressed.

[On Source Electrodes]

In the second and third embodiments, electrodes having identical shapes and materials are assumed as the ferromagnetic source electrodes. Of course, one can adopt several different kinds of source electrodes. They can be distinguished by the magnetic field strength required to reverse their magnetization directions. For example, as shown in FIG. 23, it is possible to employ two different types of source electrodes 421a and 421b. Those ferromagnetic electrodes may have distinct demagnetization coefficients. Otherwise, they may be made up of different ferromagnetic metals.

When crossing wires are formed over the source region, by adjusting the intensity and direction of current pulses flowing through the pair of the crossing wires, the generated magnetic field can be tailored so as to switch the magnetization directions of only one type of the source electrodes, whichever requires a smaller magnetic field for their magnetization reversal. The magnetization of the other type of the source electrodes stays unchanged.

As a result, a magnetization configuration of the source electrodes different from the uniform and unanimous alignment can be realized as shown in FIG. 23. The device characteristics in such a hybrid magnetization configuration will fall in-between the electric characteristics observed under unanimous magnetization along S1 and those observed under coherent magnetization along S2. It entails that the drain currents flowing in this spin-MOSFET can be magnetically modulated in three or more modes.

Of course, the more-than-bimodal variation of the magnetization configuration in the source region can further enrich the versatility of the present spin-MOSFET operation.

For example, by using such a spin-MOSFET in the memory application as described in the third embodiment, a multi-valued nonvolatile memory can be readily realized.

In addition, availability of such drain current adjustment by a multitude of different degrees enables fine-tuning of the individual device characteristics even after the manufacturing of the devices. Using the present spin-MOSFET as a post-manufacturing adjustable MOSFET, mass production of a large number of uniform devices with desired characteristics will be greatly facilitated. Since aberrant MOSFETs can be easily corrected afterward, a dramatic increase in the production yield can be expected. Because the device characteristics of miniaturized dimensions become increasingly sensitive to some intractable stochastic factors such as process-induced fluctuation in device shapes and random dopant distribution in the respective devices, mass production of identical devices is becoming a more and more difficult task to achieve nowadays. Thus, this post-manufacturing adjustment provides a significant advantage for LSI manufacturing.

Figure 24:
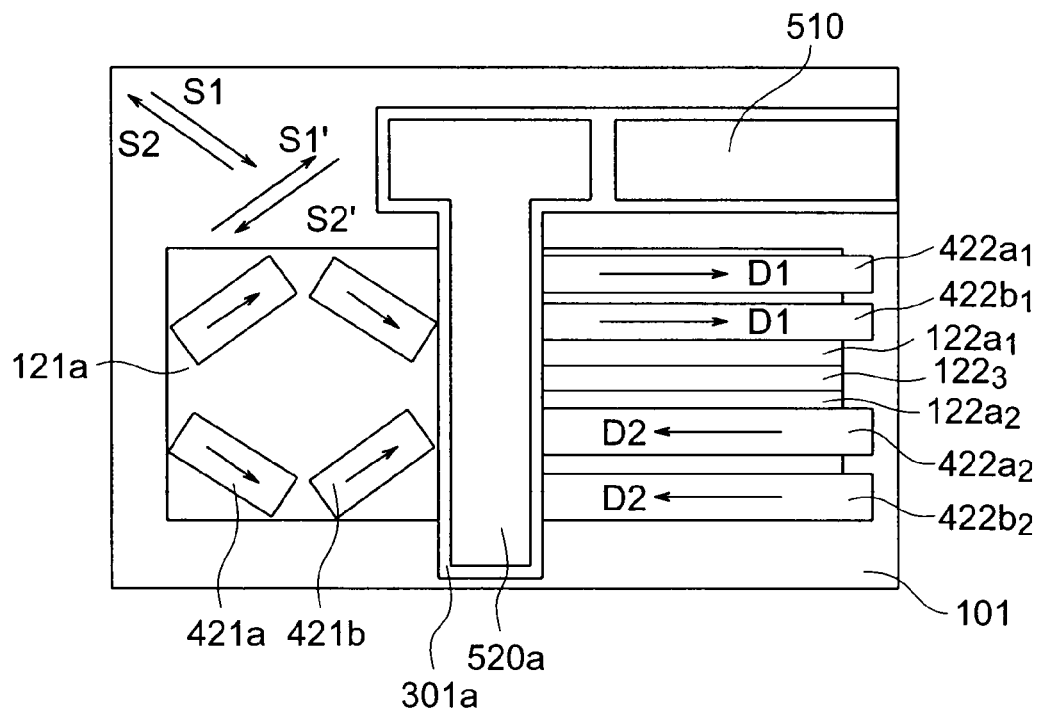
FIG. 24 is a top view outline of a semiconductor device in accordance with a second modification of the third embodiment.

Another useful example of heterogeneous source electrodes is depicted in FIG. 24. There, ferromagnetic source electrodes are laid out so that their easy axes of magnetization align not only along S1-S2 axis but also along S1'-S2' axis as well. As described preciously, the transmission probabilities of spin-polarized ☐electrons into the respective drain electrodes are even functions of the angle between the magnetization direction of the source electrode and the magnetization directions of the drain electrodes. Therefore, even when an easy axis of magnetization of a source electrode (e.g., S1-S2 axis) is rotated using the easy axis of magnetization of the drain electrodes (i.e., D1-D2 axis) as a rotation axis, into a new easy axis of magnetization (i.e., S1'-S2' axis), the extent of the magnetic modulation of the channel current remains unchanged. Thus, the device operation with source electrodes along S1-S2 axis and that with source electrodes along S1'-S2' axis are identical.

When crossing wires are formed over the source region, by adjusting the intensity and direction of current pulses flowing through the pair of the crossing wires, the generated magnetic field can be made to switch only the magnetization directions of the source electrodes 421*a* with the S1-S2 easy axis of magnetization, while the magnetization of the source electrodes 421*b* with the S1'-S2' easy axis of magnetization is left unchanged. Realization of such an intermediate magnetization configuration, unlike the concerted alignment along S1 or S1' or the coordinated alignment only along S2 or S2', induces the more-than-bimodal variation of spin-MOSFET operation as explained above. Of course, all the aforementioned advantages and benefits of such operational multiplicity also apply in this case. Obviously, the above argument is also valid even for the cases where the S1'-S2' axis is not exactly the axial rotation of the S1-S2 axis with respect to the D1-D2 axis.

Figure 25:
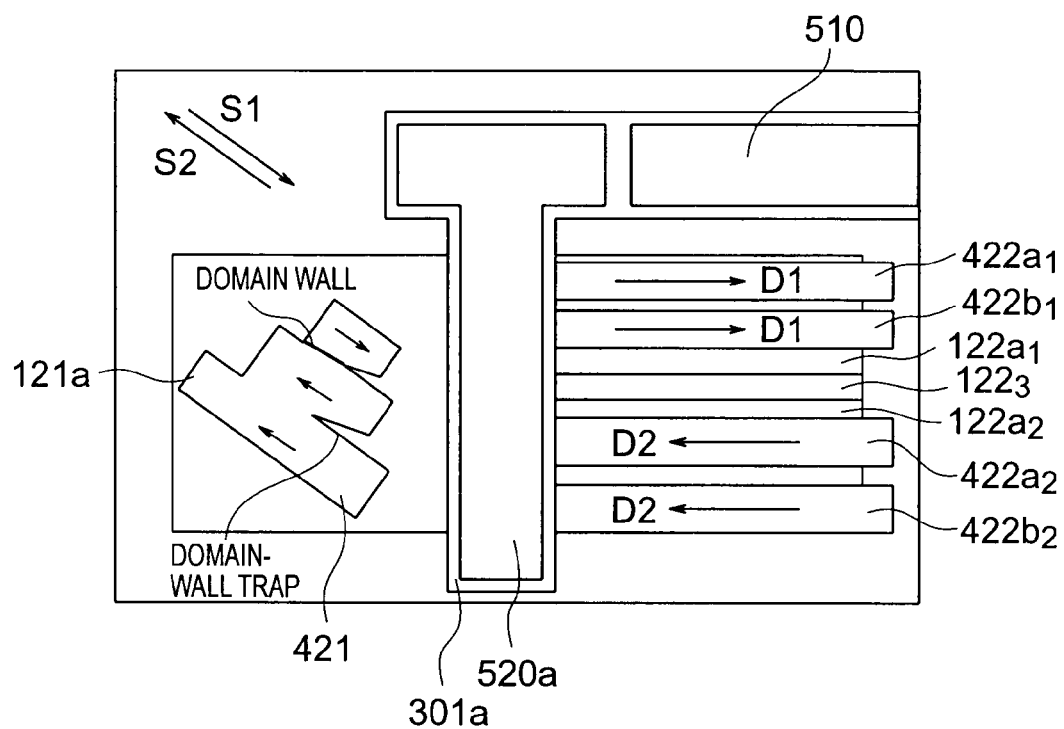
FIG. 25 is a top view outline of a semiconductor device in accordance with a third modification of the third embodiment.

Yet another way of realizing operational multiplicity of the spin-MOSFET is illustrated in FIG. 25. There, magnetic domains are formed in a single source electrode. The multi-modal operation of the spin-MOSFET can be realized by changing the a real composition of the individual magnetic domains. Because a domain wall (i.e., a boundary between magnetic domains) tends to be attracted to and trapped or pinned down around a nonmagnetic region in a ferromagnetic material, by grooving several notches in the source electrode (i.e., producing nonmagnetic wedges in the ferromagnetic metal), the position of the domain wall can be controlled so that it moves only discretely from one notch to another. Thus, the reliable and repeatable modulation of the source electrode's domain make-ups can be readily achieved in a well controlled manner, by driving their domain wall from one notch to another. The coordinated domain wall motion can be realized, e.g., by applying an appropriate magnetic field. Again, all the aforementioned advantages and benefits of the operational multiplicity also apply in this case.

[On Manufacturing of the Device]

Although an n-type spin-MOSFET and p-type MOSFETs have been utilized in the third embodiment, a p-type spin-MOSFET and n-type MOSFETs can be employed instead. Obviously, any numbers of both types of such circuit elements can be integrated in a single LSI circuit.

In addition, the partial silicidation of the upper portion of each gate electrode in the third embodiment can be replaced by total silicidation of the electrode (i.e., Fully-Silicided Gate technique).

It is also obvious that the MOSFET could have an elevated source-drain structure.

Furthermore, the semiconductor substrate can be a SOI (i.e., Silicon On Insulator) type substrate.

Regarding the substrate, it is not even limited to a Si substrate. It is possible to use a Ge or GaAs semiconductor substrate, or a composite substrate made up of heterogeneous semiconductor materials over a single supporting structure. For example, a GaAs semiconductor may be grafted in a part of the channel region of a Si substrate. When GaAs is employed as a channel semiconductor, precession of the channel electron's spin-polarization can be induced by an electric field applied from the gate electrode (the so-called Rashba effect). This effect may be further exploited to provide additional degree of freedom in modulating the device operation of the spin-MOSFET.

Advantages of the Present Invention

As described so far, the embodiments of the present invention have the following effects:

(1) Because the present spin-MOSFET behaves much like a type-2 spin-MOSFET, the present spin-MOSFET is very suitable for nonvolatile reconfigurable logic circuits.

(2) Because the present spin-MOSFET can be realized simply by forming ferromagnetic electrodes on the conventional MOS structure, the present spin-MOSFET retains manufacturing and operational compatibility with the conventional C-MOSFET circuits.

(3) Because the spin-polarized channel electrons injected from the source electrodes can always flow into either the first or the second drain electrode, undesirable charge accumulation around the drain region is avoided. The absence of the charge accumulation prevents temporal variation of electrostatic potential in the channel semiconductor and also suppresses unwanted spin-flips of the channel electrons induced by spin-dependent interactions with impurities or crystalline defects in the semiconductor or due to thermal perturbation. Therefore, a stable and reliable device operation can be obtained with the present spin-MOSFET.

(4) Because the extent of the magnetic modulation of the channel current depends only on the relative angles between the magnetization direction of the source electrodes and the magnetization directions of the drain electrodes, by appropriately placing the electrodes, the present spin-MOSFET can arbitrarily adjust the extent of the magnetic modulation, regardless of the materials used for the respective electrodes. Thus, the present spin-MOSFET provides a large latitude and additional degree of freedom in designing optimized reconfigurable circuits.

(5) Because the drain electrodes are magnetized in directions antiparallel to each other, the demagnetizing fields of these electrodes can be significantly reduced even though the two electrodes are placed in the close vicinity of each other in the drain region. Without adverse effects of the demagnetizing field, the magnetization of the drain electrodes is stable against external magnetic stimuli and remains steady even in unexpected thermal disturbances. This greatly contributes to highly selective magnetization switching only of the source electrodes, without changing the magnetization directions of the drain electrodes.

(6) Because of the high-permeability material in-between the ends of the two drain electrodes to bridge the opposite magnetic charges appearing on the respective ends of the electrodes, the anti-parallel magnetization configuration of the drain electrodes can be further stabilized. Thus, the present spin-MOSFET is capable of reliable switching of the device operation.

(7) Because the demagnetization coefficient of each source electrode is made larger than the demagnetization coefficients of the drain electrodes, the magnetization directions of the source electrodes can be safely reversed by small magnetic fields without affecting the magnetization directions of the drain electrodes.

(8) Because the respective ferromagnetic metals are formed on the heavily-doped source and drain regions, transmission of electrons between metal electrodes and the semiconductor source and drain regions are greatly facilitated by the quantum mechanical tunneling effect, despite formation of the Schottky barrier between the semiconductor layer and the ferromagnetic metals.

(9) Because of the availability of a pair of the drain electrodes and thanks to the presence of the high-resistance region between the electrodes, the respective electrodes can have different electrical potentials. Thus, the respective drain electrodes can be made to have complementary outputs corresponding to the magnetization direction of the source electrodes, realizing a nonvolatile memory with the present spin-MOSFET.

(10) Using several kinds of source electrodes with differing demagnetization coefficients or of different ferromagnetic materials, a hybrid source magnetization configuration other than that with uniform and unanimous alignment can be realized. As a result, the drain currents flowing in this spin-MOSFET can be magnetically modulated in three or more modes.

(11) Using several kinds of source electrodes laid out to have different easy axes of magnetization, a multitude of source magnetization configurations can be realized. It can induce more-than-bimodal variation of spin-MOSFET operation.

(12) Forming magnetic domains in a source electrode, the multi-modal operation of the spin-MOSFET can be realized by changing the a real composition of the individual magnetic domains. By grooving several notches in the source electrode, the position of the domain wall can be controlled so that it moves only discretely from one notch to another.

(13) The multi-modal operation of the present spin-MOSFET can realize a multi-valued nonvolatile memory.

(14) Availability of drain current adjustment by a multitude of source magnetization configurations enables fine-tuning of the individual device characteristics even after the manufacturing of the devices. By using the present spin-MOSFET as a post-manufacturing adjustable MOSFET, a dramatic increase in the production yield can be expected because aberrant MOSFETs can be easily corrected afterward.

As described so far, each embodiment of the present invention can provide a semiconductor device that includes a spin-MOSFET suitable for nonvolatile reconfigurable logic circuits. The present spin-MOSFET not only retains the manufacturing and operational compatibility with the conventional C-MOSFET circuits, but also is capable of stable and reliable device operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
a semiconductor substrate;
a first source region and a first drain region formed at a distance from each other in the semiconductor substrate;
a first channel region provided between the first source region and the first drain region;
a first gate insulating film formed on the first channel region;
a first gate electrode formed on the first gate insulating film;
a first source electrode formed above the first source region and including a ferromagnetic layer having an easy axis of magnetization in a first direction;
a first drain electrode formed above the first drain region and including a ferromagnetic layer magnetized in a second direction at an angle larger than 0 degrees but not larger than 180 degrees with respect to the first direction; and
a second drain electrode formed above the first drain region, being located at a distance from the first drain electrode, and including a ferromagnetic layer magnetized in a direction substantially antiparallel to the second direction.

2. The device according to claim 1, further comprising: a first insulating film formed on the first gate electrode; and a control gate electrode formed on the first insulating film.

3. The device according to claim 1, further comprising: a first semiconductor device connected to the first drain electrode; and a second semiconductor device connected to the second drain electrode.

4. The device according to claim 1, wherein the first source electrode includes a plurality of electrodes each including a ferromagnetic layer having an easy axis of magnetization in the first direction.

5. The device according to claim 1, further comprising a second source electrode formed above the first source region and including a ferromagnetic layer, wherein the direction of an easy axis of magnetization of the second source electrode is substantially aligned along axially rotated direction of the easy axis of magnetization of the first source electrode with respect to a rotation axis along the magnetization direction of the first drain electrode.

6. The device according to claim 1, further comprising a second source electrode formed above the first source region, and including a ferromagnetic layer having a different demagnetization coefficient from the ferromagnetic layer of the first source electrode.

7. The device according to claim 1, further comprising a second source electrode formed above the first source region, and including a ferromagnetic layer having a different composition from the ferromagnetic layer of the first source electrode.

8. The device according to claim 1, further comprising: a plurality of magnetic domains in the ferromagnetic layer of the first source electrode; and
a nonmagnetic region trapping the domain-wall of the magnetic domains.

9. The device according to claim 1, wherein two ferromagnetic conductive layers having magnetization fixed in directions antiparallel to each other are connected to the ferromagnetic layer of the first source electrode via a nonmagnetic layer.

10. The device according to claim 1, wherein a wire for reversing the magnetization direction of the ferromagnetic layer of the first source electrode is provided over the first source electrode.

11. The device according to claim 1, wherein a soft-magnetic material is provided between the first drain electrode and the second drain electrode and is electrically insulated from the first drain electrode and the second drain electrode.

12. The device according to claim 1, wherein an antiferromagnetic film is stacked on the first drain electrode or the second drain electrode.

13. The device according to claim 1, wherein a tunnel barrier layer is provided between the first source electrode and the semiconductor substrate, between the first drain electrode and the semiconductor substrate, or between the second drain electrode and the semiconductor substrate.

14. The device according to claim 1, wherein the first drain electrode and the second drain electrode have different demagnetization coefficients from each other.

15. The device according to claim 1, wherein the first drain electrode or the second drain electrode is divided into a plurality of electrodes.

16. A semiconductor device comprising:
a semiconductor substrate including a first semiconductor region of a first conductivity type;
a first source region of a second conductivity type formed in the first semiconductor region;
first and second drain regions of the second conductivity type formed at a distance from the first source region, and formed at a distance from each other in the first semiconductor region;
a first channel region provided between the first source region and the first drain region, and between the first source region and the second drain region;
a first gate insulating film formed on the first channel region;
a first gate electrode formed on the first gate insulating film;
a first source electrode formed above the first source region and including a ferromagnetic layer having an easy axis of magnetization in a first direction;
a first drain electrode formed above the first drain region and including a ferromagnetic layer magnetized in a second direction at an angle larger than 0 degrees but not larger than 180 degrees with respect to the first direction; and
a second drain electrode formed above the second drain region and including a ferromagnetic layer magnetized in a direction substantially antiparallel to the second direction.

17. The device according to claim 16, further comprising:
a second semiconductor region of the second conductivity type different from the first conductivity type in the semiconductor substrate;
a second source region and a third drain region of the first conductivity type formed at a distance from the each other in the second semiconductor region;
a second channel region provided between the second source region and the third drain region;
a second gate insulating film formed on the second channel region; and,
a second gate electrode formed on the second gate insulating film.

18. The device according to claim 16, further comprising: a first insulating film formed on the first gate electrode; and a control gate electrode formed on the first insulating film.

19. The device according to claim 16, further comprising: a first semiconductor device connected to the first drain electrode; and a second semiconductor device connected to the second drain electrode.

20. The device according to claim 16, wherein the first source electrode includes a plurality of electrodes each including a ferromagnetic layer having an easy axis of magnetization in the first direction.

21. The device according to claim 16, further comprising a second source electrode formed above the first source region and including a ferromagnetic layer, wherein the direction of an easy axis of magnetization of the second source electrode is substantially aligned along axially rotated direction of the easy axis of magnetization of the first source electrode with respect to a rotation axis along the magnetization direction of the first drain electrode.

22. The device according to claim 16, further comprising a second source electrode formed above the first source region, and including a ferromagnetic layer having a different demagnetization coefficient from the ferromagnetic layer of the first source electrode.

23. The device according to claim 16, further comprising a second source electrode formed above the first source region, and including a ferromagnetic layer having a different composition from the ferromagnetic layer of the first source electrode.

24. The device according to claim 16, further comprising: a plurality of magnetic domains in the ferromagnetic layer of the first source electrode; and a nonmagnetic region trapping the domain-wall of the magnetic domains.

25. The device according to claim 16, wherein two ferromagnetic conductive layers having magnetization fixed in directions antiparallel to each other are connected to the ferromagnetic layer of the first source electrode via a nonmagnetic layer.

26. The device according to claim 16, wherein a wire for reversing the magnetization direction of the ferromagnetic layer of the first source electrode is provided over the first source electrode.

27. The device according to claim 16, wherein a soft-magnetic material is provided between the first drain electrode and the second drain electrode and is electrically insulated from the first drain electrode and the second drain electrode.

28. The device according to claim 16, wherein an antiferromagnetic film is stacked on the first drain electrode or the second drain electrode.

29. The device according to claim 16, wherein a tunnel barrier layer is provided between the first source electrode and the semiconductor substrate, between the first drain electrode and the semiconductor substrate, or between the second drain electrode and the semiconductor substrate.

30. The device according to claim 16, wherein the first drain electrode and the second drain electrode have different demagnetization coefficients from each other.

31. The device according to claim 16, wherein the first drain electrode or the second drain electrode is divided into a plurality of electrodes.

* * * * *